(12) United States Patent
Hao et al.

(10) Patent No.: US 9,477,354 B2
(45) Date of Patent: Oct. 25, 2016

(54) CONDUCTIVE TRACE HIDING MATERIALS, ARTICLES, AND METHODS

(71) Applicant: 3M INNOVATIVE PROPERTIES COMPANY, St. Paul, MN (US)

(72) Inventors: Encai Hao, Woodbury, MN (US); Abdujabar K. Dire, Woodbury, MN (US); Albert I. Everaerts, Oakdale, MN (US); Aya Nakada, Kawasaki (JP); Ross E. Behling, Woodbury, MN (US); Guy D. Joly, Shoreview, MN (US); David B. Olson, Marine on St. Croix, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 354 days.

(21) Appl. No.: 13/832,457

(22) Filed: Mar. 15, 2013

(65) Prior Publication Data

US 2014/0138131 A1    May 22, 2014

Related U.S. Application Data

(60) Provisional application No. 61/727,590, filed on Nov. 16, 2012.

(51) Int. Cl.
*G06F 3/044* (2006.01)
*G02B 1/115* (2015.01)
*H05K 1/02* (2006.01)

(52) U.S. Cl.
CPC ............... *G06F 3/044* (2013.01); *G02B 1/115* (2013.01); *G06F 2203/04103* (2013.01); *H05K 1/0274* (2013.01); *H05K 2201/0108* (2013.01); *H05K 2201/0326* (2013.01); *Y10T 156/10* (2015.01); *Y10T 428/1452* (2015.01); *Y10T 428/24942* (2015.01); *Y10T 428/31649* (2015.04);

(Continued)

(58) Field of Classification Search
USPC .......................................... 428/172; 174/257
See application file for complete search history.

(56) References Cited

U.S. PATENT DOCUMENTS

| 4,737,018 A | 4/1988 | Iwashita |
| 5,684,554 A | 11/1997 | Sperger |
| 6,376,590 B2 | 4/2002 | Kolb |

(Continued)

FOREIGN PATENT DOCUMENTS

| JP | 06222352 | 8/1994 |
| JP | 09185457 | 7/1997 |

(Continued)

OTHER PUBLICATIONS

U.S. Appl. No. 61/727,384, filed Nov. 16, 2012—"Adhesive Including Pendant (Meth)Acryloyl Groups, Article, and Method".

(Continued)

*Primary Examiner* — Timothy Thompson
*Assistant Examiner* — Krystal Robinson

(57) ABSTRACT

An article includes a patterned substrate including a substrate surface with an inorganic electro-conductive trace adjacent thereto (wherein the substrate and the inorganic material of the trace each has an index of refraction), and a layer including a polymerized acrylate matrix adjacent to at least a portion of the surface of the substrate and the inorganic electro-conductive trace, wherein the layer has an index of refraction that is within ±10% of the average of the indices of refraction of the substrate and the inorganic material of the trace.

26 Claims, 2 Drawing Sheets

(52) U.S. Cl.
CPC . *Y10T428/31797* (2015.04); *Y10T 428/31928* (2015.04)

(56) References Cited

U.S. PATENT DOCUMENTS

| | | |
|---|---|---|
| 6,783,850 B2 | 8/2004 | Takizawa |
| 6,939,911 B2 | 9/2005 | Tosaki |
| 7,977,170 B2 | 7/2011 | Tredwell |
| 8,137,801 B2 | 3/2012 | Walker, Jr. |
| 8,378,046 B2 | 2/2013 | Determan et al. |
| 8,512,464 B2 | 8/2013 | Joly |
| 8,611,010 B2 | 12/2013 | Radcliffe |
| 8,663,811 B2 | 3/2014 | Everaerts et al. |
| 8,772,425 B2 | 7/2014 | Determan et al. |
| 2001/0005258 A1 | 6/2001 | Kobayashi |
| 2006/0134362 A1* | 6/2006 | Lu et al. ............... 428/40.1 |
| 2006/0148950 A1 | 7/2006 | Davidson |
| 2009/0087629 A1* | 4/2009 | Everaerts ............ B32B 7/12 428/203 |
| 2009/0105437 A1 | 4/2009 | Determan |
| 2009/0237786 A1* | 9/2009 | Yoshihara et al. ........ 359/488 |
| 2010/0110551 A1* | 5/2010 | Lamansky et al. ........ 359/599 |
| 2010/0150513 A1* | 6/2010 | Zhang et al. ............. 385/131 |
| 2010/0222496 A1 | 9/2010 | Determan |
| 2011/0126734 A1* | 6/2011 | Joly ..................... C01G 25/02 106/287.19 |
| 2011/0298361 A1 | 12/2011 | Matsunaga |
| 2012/0241199 A1 | 9/2012 | Kobayashi |

FOREIGN PATENT DOCUMENTS

| | | |
|---|---|---|
| JP | 2001264505 | 9/2001 |
| JP | 2007-84762 A | 9/2005 |
| JP | 2006-342258 A | 12/2006 |
| JP | 2007-23225 A | 2/2007 |
| JP | 2009-120726 A | 4/2009 |
| JP | 2009-299096 | 12/2009 |
| JP | 2012-52010 A | 3/2012 |
| JP | 5 691 279 | 2/2015 |
| WO | WO 0056543 | 9/2000 |
| WO | WO 2009058551 | 5/2009 |
| WO | WO 2010/040014 A1 | 4/2010 |
| WO | WO 2010/084405 A1 | 7/2010 |
| WO | WO 2011/112447 A2 | 2/2011 |
| WO | WO 2011/119828 A1 | 9/2011 |
| WO | WO 2012087665 | 6/2012 |
| WO | 2012/141134 | 10/2012 |

OTHER PUBLICATIONS

U.S. Appl. No. 61/604,169—"Composition comprising surface modified high index nanoparticles suitable for optical coupling layer".
Multek Product Sheet G907100 Refractive Index Matched ITO Coated PET film.
Sheldahl Product bulletin G907100 Refractive Index Matched ITO Coated PET Films.
International Search Report for International Publication No. PCT/US2013/069547, dated Jun. 25, 2014.

* cited by examiner

CONDUCTIVE TRACE HIDING MATERIALS, ARTICLES, AND METHODS

BACKGROUND

Optically clear pressure-sensitive adhesives (OCAs) find wide applications in optical displays. Such applications include, but are not limited to, bonding polarizers to modules of a liquid crystal display (LCD) and attaching various optical films to a glass lens in mobile hand held devices (MHH). The polarizers may be in direct or indirect contact with the OCA. Furthermore, widely used touch panels, i.e., touch screens, typically include indium-tin oxide-(ITO) coated polyethylene terephthalate film or ITO-coated glass. The ITO is typically in a patterned trace form and is electro-conductive. These ITO-coated substrates are often attached to the display modules using OCAs. In some touch panel designs, the OCA can come in direct contact with the electro-conductive ITO traces. In such a case, the OCAs need to be compatible with the ITO trace, i.e., the OCA should cause no more than minimal change in the electrical resistance of the ITO trace while the OCA remains in contact with the ITO trace.

A major issue, particularly in capacitive touch screen applications, is that the ITO patterns often remain highly visible due to the refractive index mismatch between the ITO, the substrate, and, if used, an OCA. Due to the higher reflection of the ITO traces they stand out from the surrounding areas. Especially from some viewing angles and/or under specific light conditions the pattern is clearly visible, which is objected to by the device makers and their customers. In view of various attempts at solving this problem, e.g., through the use of coatings with high indices of refraction to match the index of the ITO trace, great technical challenges still remain to hide ITO traces and other electro-conductive traces.

SUMMARY

The present disclosure provides a solution to the problem of easily visible electro-conductive traces, particularly ITO traces.

In one embodiment, the present disclosure provides an article that includes a patterned substrate including a substrate surface with an inorganic electro-conductive trace adjacent thereto, wherein the substrate and the inorganic material of the trace each has an index of refraction; and a layer including a polymerized acrylate matrix (optionally having inorganic nanoparticles dispersed therein) adjacent to at least a portion of the surface of the substrate and the inorganic electro-conductive trace.

In certain embodiments, the polymerized acrylate matrix (optionally having inorganic nanoparticles dispersed therein) has an index of refraction that is within ±10% of the average of the indices of refraction of the substrate and the inorganic material of the trace.

In certain embodiments, the polymerized acrylate matrix includes inorganic nanoparticles dispersed therein. In certain embodiments, the inorganic nanoparticles are surface-modified inorganic nanoparticles.

In certain embodiments, the substrate of the article is, or is part of, a transparent display substrate selected from a lens, a touch sensor, a light emissive display, or a light reflective display.

In one embodiment, the present disclosure provides an article including: a substrate having a substrate surface, wherein the substrate is selected from glass, ITO-patterned glass, unprimed PET, and cyclo-olefin copolymers; and a polymerized acrylate matrix coating disposed thereon, wherein the polymerized acrylate matrix includes N-hydroxyurea functional groups; wherein the N-hydroxyurea functional groups promote adhesion of the coating to the substrate.

The present disclosure also provides methods of making an article as described herein, including methods of coating a patterned substrate.

In one embodiment, the method of making an article includes: providing a patterned substrate having a substrate surface with an inorganic electro-conductive trace adjacent thereto, wherein the substrate and the inorganic material of the trace each has an index of refraction; and applying a polymerized acrylate matrix (optionally having inorganic nanoparticles dispersed therein) to at least a portion of the patterned substrate surface; wherein the polymerized acrylate matrix has an index of refraction that is within ±10% of the average of the indices of refraction of the substrate and the inorganic material of the trace.

In certain embodiments, applying a polymerized acrylate matrix includes applying a laminate, wherein the laminate includes: a layer including an optically clear adhesive; and a layer including a polymerized acrylate matrix (optionally having inorganic nanoparticles dispersed therein) adjacent to the optically clear adhesive layer. Upon applying to the patterned substrate, the laminate is positioned such that the polymerized acrylate matrix is disposed between the patterned substrate surface and the optically clear adhesive.

In certain embodiments, after applying the laminate, the method further includes applying energy (e.g., light or heat) to the polymerized acrylate matrix to crosslink the acrylate matrix or to increase the crosslinking of the acrylate matrix.

In one embodiment, a method of coating is provided that includes: providing a patterned substrate that includes a substrate surface with an inorganic electro-conductive trace adjacent thereto, wherein the substrate and the inorganic material of the trace each has an index of refraction; applying a coating composition to at least a portion of the patterned substrate surface to form a coated surface, wherein the coating composition includes a polymerizable acrylate matrix (optionally having inorganic nanoparticles dispersed therein); and polymerizing the polymerizable acrylate matrix (of the coating composition) to form a layer including a polymerized acrylate matrix; wherein the polymerized acrylate matrix has an index of refraction that is ±10% of the average of the indices of refraction of the substrate and the inorganic material of the trace. In certain embodiments, the method further includes applying an optically clear adhesive on the coated surface, wherein polymerizing the polymerizable acrylate matrix occurs before or after applying the optically clear adhesive.

In one embodiment, a method of coating is provided that includes: providing a patterned substrate that includes a substrate surface with an inorganic electro-conductive trace adjacent thereto; applying a coating composition to at least a portion of the patterned substrate surface to form a coated surface; and polymerizing the polymerizable acrylate matrix (of the coating composition) to form a layer that includes a polymerized acrylate matrix. In this method, the coating composition includes: a polymerizable acrylate matrix that includes N-hydroxyurea functional groups; inorganic nanoparticles dispersed in the polymerizable acrylate matrix; and an initiator. In certain embodiments, the method further includes applying an optically clear adhesive on the coated surface, wherein polymerizing the polymerizable acrylate matrix occurs before or after applying the optically clear adhesive.

The present disclosure also provides laminates.

In one embodiment a laminate includes: a first liner; a layer including a high index material adjacent the first liner; a layer including a low index material adjacent the layer comprising a high index material; and a second liner adjacent the layer including a low index material.

In a second embodiment, a laminate includes: a first liner; a first layer including a high index material adjacent the first liner; a layer including a low index material adjacent the layer comprising a high index material; a second layer including a high index material (which may or may not be the same material of the first layer) adjacent the layer including a low index material; and a second liner adjacent the second layer including a high index material.

In certain embodiments of the laminates, the low index material is an optically clear adhesive, and the high index material is a polymerized acrylate matrix with optional inorganic nanoparticles dispersed therein. In certain embodiments, the polymerized acrylate matrix with optional inorganic nanoparticles dispersed therein is an adhesive (e.g., a pressure sensitive adhesive or a heat-activated adhesive).

Thus, in certain embodiments, the polymerized acrylate matrix with optional inorganic nanoparticles dispersed therein can function as an adhesive. In certain embodiments, it is a pressure-sensitive adhesive, and in certain embodiments, a heat-activated adhesive (e.g. a hot melt adhesive).

Herein, pressure-sensitive adhesives (PSA) are defined as adhesives that meet the Dahlquist criteria for tack at room temperature and behave as an adhesive (i.e., provide a balance of adhesion, cohesion, compliance, and elasticity).

Heat-activated adhesives ("HAs") are defined as adhesives that are non-tacky at room temperature but become temporarily tacky (i.e., they are activated at an activation temperature) and are capable of bonding to a substrate at elevated temperatures. At or above this activation temperature, they have the same characteristics as PSAs (i.e., adhesion, cohesion, compliance, and elasticity). Heat-activated adhesives usually have a glass transition temperature ($T_g$) or melting point ($T_m$) above room temperature. When the temperature is elevated above the $T_g$ or $T_m$, the storage modulus usually decreases and the adhesive becomes tacky.

In contrast, when the temperature is lowered below the $T_g$ or $T_m$, the storage modulus usually increases and the adhesive tack is reduced, although bonding strength is retained or increases.

Herein, the phrases "high index" and "high refractive index" and "high index of refraction" are used interchangeably.

Herein, the phrases "low index" and "low refractive index" and "low index of refraction are used interchangeably.

Herein, "adjacent" can be used to refer to two materials, typically in the form of layers, that are in direct contact or that are separated by one or more other materials, such as primer or hard coating layers. Often, adjacent materials are in direct contact.

The terms "comprises" and variations thereof do not have a limiting meaning where these terms appear in the description and claims.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and preferably by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used.

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of about 20° C. to about 25° C. or about 22° C. to about 25° C.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

DETAILED DESCRIPTION OF EXEMPLARY EMBODIMENTS

Figure 1:
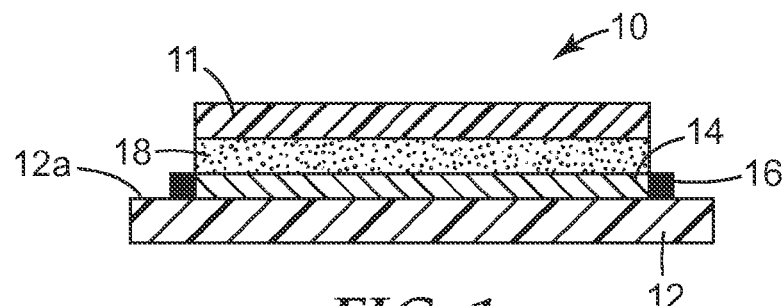
FIG. 1 is a cross-sectional view of an exemplary article according to the present disclosure.

The present disclosure provides high refractive index materials, articles, and methods that address the problem of visible inorganic electro-conductive traces, particularly ITO traces, in articles that include, for example, touch screens.

Generally, the problem is addressed by using a material that has an index of refraction that is within ±10% of the average of the indices of refraction of the substrate and the inorganic material of the trace. This provides significant improvement over other methods that involve using a material that has an index of refraction that matches the index of refraction of the inorganic electro-conductive traces.

Advantageously, the material that has an index of refraction that is within ±10% of the average of the indices of refraction of the substrate and the inorganic material of the trace can also be applied over the conductive trace patterned substrate to reduce the pattern visibility, without requiring a high index undercoating for the patterned conductive trace that would be commonly used to hide the pattern. Such a high index undercoating typically is a close match to the refractive index of the conductive trace material.

For example, in an article that includes a patterned substrate including a substrate surface with an inorganic electro-conductive trace adjacent thereto (wherein the substrate and the inorganic material of the trace each has an index of refraction), a layer including a polymerized acrylate matrix is adjacent to at least a portion of the surface of the substrate and the inorganic electro-conductive trace, wherein the polymerized acrylate matrix has an index of refraction that is within ±10% of the average of the indices of refraction of the substrate and the inorganic material of the trace. In certain embodiments, the polymerized acrylate matrix has an index of refraction that is within ±5% of the average of the indices of refraction of the substrate and the inorganic material of the trace.

In certain embodiments, the polymerized acrylate matrix includes inorganic nanoparticles dispersed therein. In certain embodiments, the inorganic nanoparticles are surface-modified inorganic nanoparticles. In such embodiments, the combination of the polymerized acrylate matrix having the inorganic nanoparticles dispersed therein has an index of refraction that is within ±10% of the average of the indices of refraction of the substrate and the inorganic material of the trace. In certain embodiments, the combination of the polymerized acrylate matrix having the inorganic nanoparticles dispersed therein has an index of refraction that is within ±5% of the average of the indices of refraction of the substrate and the inorganic material of the trace.

Typically, the polymerized acrylate matrix without inorganic nanoparticles dispersed therein has an index of refraction of at least 1.55, and often no greater than 1.72.

Typically, the polymerized acrylate matrix with inorganic nanoparticles dispersed therein has an index of refraction of at least 1.55, and often no greater than 1.9.

This relatively high refractive index of the acrylate matrix can come from the matrix itself or from the nanoparticles, or both. For example, the acrylate matrix may be of a generally low refractive index material (e.g., derived from low refractive index monomers) as long as the inorganic nanoparticles have a relatively high refractive index. Alternatively, the acrylate matrix may be of a generally high refractive index material, in which case, inorganic nanoparticles may or may not be used.

Turning to the figures, FIG. 1 depicts a cross-sectional view of an exemplary article 10 having a first substrate 12. Adjacent to a first surface 12a of the substrate is an inorganic electro-conductive trace 14. The trace forms a grid on the first surface 12a. The edges of the trace end at electrical connector pads 16.

Typically, the substrate 12 has an index of refraction of at least 1.45, and often no greater than 1.65. Exemplary substrates may be made of a material such as glass, polyethylene terephthalate (PET), cyclo-olefin copolymer (COP), polycarbonate, polymethyl methacrylate, or a polarizer film. In certain embodiments, the substrate is, or is part of, a transparent display substrate selected from a lens, a touch sensor, a light emissive display, or a light reflective display.

Typically, the inorganic material of the inorganic electro-conductive trace 14 has an index of refraction at least 1.65, and often no greater than 2.5. Exemplary materials used to produce inorganic electro-conductive traces include indium tin oxide, doped ZnO, and antimony tin oxide.

In certain embodiments, the materials of the substrate and the inorganic electro-conductive trace are selected such that the difference between the indices of refraction of the substrate and the inorganic material of the trace is greater than 0.2.

As shown in FIG. 1, a polymerized acrylate matrix 18 (optionally having dispersed therein inorganic nanoparticles) is adjacent to the trace 14. Because the trace is in a grid format, a portion of the polymerized acrylate matrix 18 may be in direct contact with the exposed first surface 12a of the first substrate 12. The polymerized acrylate matrix 18 is typically disposed in a layer, on at least a portion of the surface 12a of the substrate 12 and the inorganic electro-conductive trace 14. The thickness of the polymerized acrylate matrix layer is sufficient to completely cover the trace. The thickness may not be uniform across its entire surface, as there may be depressions or valleys between the traces.

Although not shown in FIG. 1, in certain embodiments, the inorganic electro-conductive trace may have a thin barrier (protective) layer adjacent thereto (not shown), in which case the polymerized acrylate matrix 18 will not directly contact the trace. Such protective material may include sputtered silicon dioxide or silicon carbide, or a highly crosslinked acrylate or epoxy based hard coating.

Optionally, the embodiment includes a second substrate 11 adjacent to the polymerized acrylate matrix 18. The first substrate and second substrate, if used, are optically clear.

Exemplary optically clear substrates include, but are not limited to, a display panel, such as liquid crystal display, an OLED display, a touch panel, electrowetting display or a cathode ray tube, a window or glazing, an optical component such as a reflector, polarizer, diffraction grating, mirror, or cover lens, another film such as a decorative film or another optical film. In some cases, the second substrate 11 can be an ITO patterned substrate as well (i.e., similar to substrate 12 with an ITO trace 14 and connector pad 16).

Representative examples of optically clear substrates include glass and polymeric substrates including those that contain polycarbonates, polyesters (e.g., polyethylene terephthalates and polyethylene naphthalates), polyurethanes, poly(meth)acrylates (e.g., polymethyl methacrylates), polyvinyl alcohols, polyolefins such as polyethylenes, polypropylenes, cyclic olefin copolymers, and cellulose triacetates. Typically, cover lenses can be made of glass, poly(methyl methacrylates), or polycarbonate.

In some cases, a conventional optically clear adhesive (i.e., a low refractive index material) can be positioned between the polymerized acrylate matrix 18 and the second substrate 11.

Figure 2:
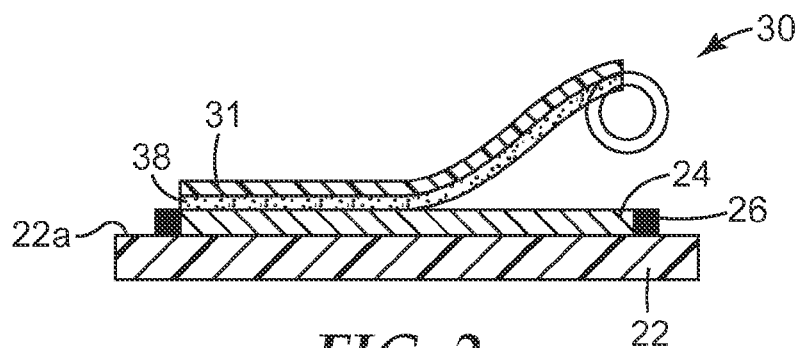
FIG. 2 is a schematic view of an exemplary method of making an article according to the present disclosure.

FIG. 2 depicts a schema view of an exemplary process of making an article of FIG. 1. The process includes a step of providing a first substrate 22 having a first surface 22a. An inorganic electro-conductive trace 24 with electrical connector pads 26 is adjacent to the first surface 22a. A roll of transfer tape 30 is provided. The roll of tape includes a polymerized acrylate matrix 38 coated on a liner 31, and an optional optically clear adhesive (not shown) disposed between the liner 31 and the polymerized acrylate matrix 38.

Optionally, the liner includes release coatings allowing for the roll of tape to unwind. The transfer tape is laminated to the first surface 22a of the first substrate 22 such that the polymerized acrylate matrix 38 is in contact with the trace 24.

Typically, the liner 31 is removed and discarded and a second substrate can be laminated onto the polymerized acrylate matrix, or if used, onto the optically clear adhesive (not shown) disposed between the liner and the polymerized acrylate matrix 38. The second substrate (not shown in FIG. 2, but analogous to 11 in FIG. 1, if used, is typically optically clear. Examples of optically clear substrates are described above. Upon lamination of the two substrates, a bond is typically formed without an air gap.

In certain embodiments, after applying the laminate, energy (e.g., light or heat) can be applied to the polymerized acrylate matrix to crosslink the acrylate matrix or to increase the crosslinking of the acrylate matrix.

While FIG. 2 depicts the use of a transfer tape, the method can also be practiced using cut sheets or die cuts made from these transfer tapes. Also, in certain embodiments, the polymerized acrylate matrix 38 can also include a second protective liner adjacent thereto (not shown).

The present disclosure also provides laminates, for example, in the form of transfer tapes. In one embodiment, such a laminate includes a layered construction of a high index material and a low index material disposed between two liners. In another embodiment, such a laminate includes a layered construction of two layers of a high index material, a layer of a low index material disposed between the two layers of high index material, and liners on the outer surface of each high index material layer. Such embodiments are exemplified in FIG. 3 and FIG. 4.

Figure 3:
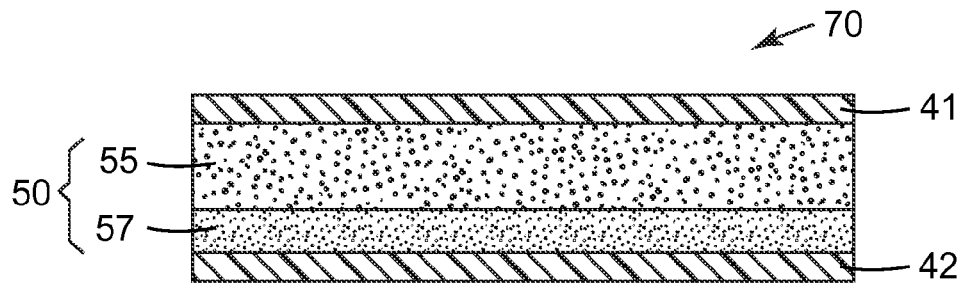
FIG. 3 is a schematic view of an exemplary laminate according to the present disclosure.

An exemplary transfer tape is shown in FIG. 3 as laminate 70. As disclosed above with respect to FIG. 2 for the roll of tape, laminate 70 includes a high index material 57 (e.g., a polymerized acrylate matrix with optional inorganic nanoparticles dispersed therein, as disclosed herein) and a low index material 55 (e.g., a conventional optically clear adhesive) disposed between the liner 41 and the high index material 57. Thus, an exemplary laminate 70 includes a construction 50 (preferably, an adhesive construction 50) that includes a high index material 57 and a low index material 55 disposed between liners 41 and 42.

Figure 4:
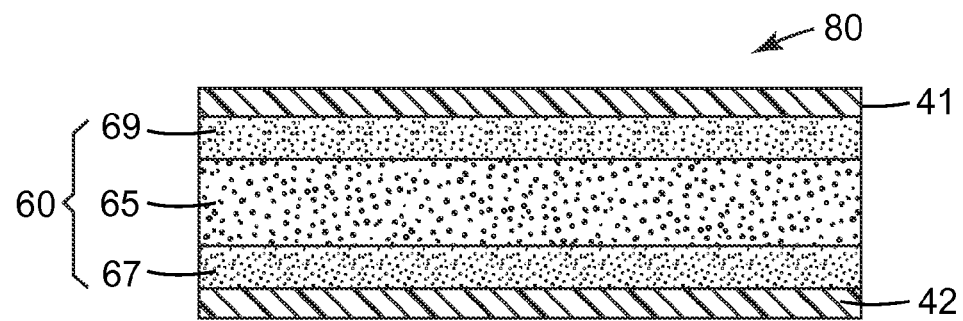
FIG. 4 is a schematic view of another exemplary laminate according to the present disclosure.

Another exemplary transfer tape is shown in FIG. 4 as laminate 80. Laminate 80 includes a construction 60 (preferably, an adhesive construction 60), which includes two layers 67 and 69 of a high index material (e.g., a polymerized acrylate matrix with optional inorganic nanoparticles dispersed therein, as disclosed herein) with a low index material 65 (e.g., a conventional optically clear adhesive) disposed between them. This construction 60 is disposed between liners 41 and 42. The layers 67 and 69 may or may not include the same material.

In certain embodiments of the laminates of FIG. 3 and FIG. 4, the low index material is an optically clear adhesive, and the high index material is a polymerized acrylate matrix with optional inorganic nanoparticles dispersed therein. In certain embodiments, the polymerized acrylate matrix with optional inorganic nanoparticles dispersed therein is an adhesive. In certain embodiments, the adhesive is at least one of a pressure sensitive adhesive and a heat-activated adhesive.

By removing the liners, the transfer tapes can be used to deliver a single layer of the high index layer (e.g., polymerized acrylate matrix) 38, shown in FIG. 2, or they can be used to deliver a combination of high index layer and low index layer (respectively, laminate 50 in FIG. 3, and laminate 60 in FIG. 4) to a substrate having conductive traces thereon. To obtain the optical hiding power, the high index layer of the laminate is positioned so it is adjacent to the conductive traces of the substrate. When using a single layer of a polymerized acrylate matrix, e.g., layer 38 of FIG. 2, the layer thickness is preferably at least 12.5 microns, or at least 25 microns, or at least 50 microns, or at least 75 microns, or at least 100 microns, or more. Below 12.5 microns, the single layer may not be compliant enough to fully cover the conductive traces and fill the air gap between the substrates of the display. If the polymerized acrylate matrix 38 contains inorganic nanoparticles, the compliance and flow of the matrix may be reduced, especially when higher loadings of the inorganic nanoparticles are used. In those cases, a layer thickness of at least 25 microns may be required. In addition, some display assemblies require that the high index material also fill in the decorative ink step of a lens. These ink steps may be 10 to 100 microns in height, requiring even thicker coatings of the high index layer (e.g., polymerized acrylate matrix) 38. Since the raw materials cost for these high index layers can be significant, increasing the layer thickness can be very costly. Thus, it may be advantageous to use a multi-layer construction (e.g., construction 50 in FIG. 3 or construction 60 in FIG. 4).

Indeed, while one can still use the same coating thicknesses for the high index layer as discussed above, it has been discovered that by combining the high index layer with a low index layer (e.g., a conventional OCA layer), these laminates can still provide the optical benefit of conductive trace hiding, while at the same time maintaining or improving the adhesive and gap filling properties. Indeed, a low index layer (e.g., a conventional OCA layer) can add thickness and compliance to the laminate, while a high index layer when attached to the conductive trace patterned substrate provides the hiding power. In addition, because the conventional OCA layer can contribute significant viscoelastic and adhesive properties to the laminate, it is possible to reduce the coating thickness of the high index layer without compromising the adhesive properties. A conventional OCA layer has a typical thickness of at least 25 microns, or at least 50 microns, or at least 75 microns, or at least 100 microns, or at least 125 microns, or at least 150 microns, or even more. Advantageously, as a result of this combination, the thickness of a high index layer can now be reduced to 12.5 microns or less, 10 microns or less, 8 microns or less, or even less. As long as the high index layer can fully cover the conductive traces on the substrate, optical hiding power can be obtained. Often, the minimal coating thickness of the high index layer is at least 1 micron, or at least 2 microns, or at least 3 microns, or more. Thus, the laminates shown in FIG. 3 and FIG. 4 provide significant advantage.

Suitable liners include flexible backing materials conventionally used as a tape backing, optical film, or release liner. In general, any suitable flexible material can be used with no specific limitations on its refractive index or optical clarity since it is removed and does not become part of the article that includes the patterned substrate. Typical examples of flexible backing materials used as tape backings that may be useful for the laminates described herein include those made of paper (e.g., Kraft paper) or polymeric films such as polypropylene, polyethylene, polyurethane, polyester (e.g., polyethylene terephthalate), ethylene vinyl acetate, cellulose acetate, and ethyl cellulose. Some flexible backings may have coatings. For example a release liner may be coated with a low adhesion component, such as a silicone-containing material or a fluorocarbon-containing material.

In certain embodiments, the polymerized acrylate matrix with optional inorganic nanoparticles dispersed therein can function as an adhesive. In certain embodiments, it is a pressure-sensitive adhesive, and in certain embodiments, a heat-activated adhesive.

If desired, an adhesive, other than that of the polymerized acrylate matrix, can be included in embodiments of the disclosure. This adhesive may be pressure-sensitive or heat-activated. For example, in the case where the high refractive index layer facing the conductive trace is already cured, it is also possible to apply a liquid optically clear adhesive (LOCA) between the cured high refractive index layer facing the conductive trace and a second substrate, followed by curing the LOCA. Such optically clear adhesives can be of the type disclosed in International Publication Nos. WO2010/084405A1 and WO2011/119828A1. Alternatively, a fully cured optically clear adhesive can also be applied to the acrylate matrix. Such optically clear adhesives can be of the type disclosed in U.S. Patent Application Publication No. 2009//0087629, and International Publication Nos. WO 2010/040014A1 and WO 2011/112447A2.

As noted above, the polymerized acrylate matrix with optional inorganic nanoparticles dispersed therein has a relatively high index of refraction (e.g., 1.55-1.9 with inorganic nanoparticles dispersed therein, or e.g., 1.55-1.72 without inorganic nanoparticles dispersed therein). Thus, such material is referred to herein as a "high index material" or a "high index layer."

The phrases "high index" and "high refractive index" as used herein, refer to an index of refraction of 1.55 and higher, and in certain embodiments, 1.6 and higher. The phrases "low index" and "low refractive index" as used herein, refer to an index of refraction of less than 1.55, in certain embodiments, 1.52 and lower, and in certain embodiments 1.50 and lower.

In certain embodiments, the polymerized acrylate matrix with optional inorganic nanoparticles dispersed therein is also optically clear. Herein, "optically clear" means that a material (in a 50 micron thick layer) has an optical transmission value of at least 85%, preferably at least 90%. The term "optical transmission value" refers to the percentage of light that is not reflected back toward the source as a percentage of the total incident light at a wavelength of 400-700 nm (light emitted/light source×100). Also, in certain embodiments, the polymerized acrylate matrix with optional inorganic nanoparticles dispersed therein (measured for a 50 micron thick layer) demonstrates less than 2% haze, preferably less than 1%. A small amount of haze may be desirable in certain situations, for additional hiding power.

Although, typically, the polymerized acrylate matrix possesses a neutral color (i.e., no added colorants such that the "a" and "b" values on the CIE LAB scale are below ±0.5), it may be desirable in certain situations to allow for some color for additional hiding power or for better color output from the display.

Also, in certain embodiments, the polymerized acrylate matrix with optional inorganic nanoparticles dispersed therein demonstrates good adhesion to the substrate and inorganic electro-conductive trace. By this it is meant that the matrix has sufficient adhesion for a laminate that includes a high index layer of the polymerized acrylate matrix, a substrate with inorganic electro-conductive trace, and a second substrate (that is not a release liner) to pass the durability testing commonly used for electronic devices.

Such durability testing typically includes three tests on separate samples of each material under evaluation: (test 1) exposure to 65° C. and 90% relative humidity; (test 2) exposure to 85° C. (no moisture added); and (test 3) temperature cycling (for example, −40° C. for 8 hours, ramp to 85° C. in one hour, hold for 8 hours at 85° C., and cool down in one hour to −40° C.). To "pass" each test, means that after 3 days of exposure to the listed conditions, the adhesive layer shows no signs of delamination or bubble formation.

Also, in certain embodiments, the polymerized acrylate matrix with optional inorganic nanoparticles dispersed therein demonstrates little or no change in the conductivity of the inorganic electro-conductive traces. Generally, when exposed for 21 days to 65° C. and 90% relative humidity, the high index layer in direct contact with the electro-conductive trace should not cause more than 20% change (preferably, there is no change) in the electrical resistance of the trace.

Acrylate Matrix

The polymerized acrylate matrix is formed from a polymerizable acrylate matrix. In this context, a polymerized acrylate matrix is formed from one or more of (meth)acrylate monomers, (meth)acrylamide monomers, (meth)acrylate-functional oligomers, (meth)acrylamide-functional oligomers, (meth)acrylate copolymers having pendant (meth)acryloyl groups and optional hydroxyl groups, (meth)acrylate-derived oligomeric or polymeric groups on inorganic nanoparticles, (meth)acrylamide-derived oligomeric or polymeric groups on inorganic nanoparticles, or combinations thereof.

Thus, herein, an "acrylate matrix" includes acrylates and methacrylates as well as acrylamides and methacrylamides including monomers, oligomers, polymers, and functionalized nanoparticles. Such materials may include (meth)acrylate-functional materials wherein such functional groups are terminal or pendant groups on a backbone derived from a polyester, epoxy, or polyurethane, for example.

Examples of acrylate monomers include (meth)acrylic ester monomers (i.e., (meth)acrylic acid ester monomers or (meth)acrylate monomers), high refractive index monomers (which typically include an aromatic group), polar monomers, and other optional monomers.

The (meth)acrylate monomers can include aliphatic, cycloaliphatic, or aromatic groups. Useful (meth)acrylates (i.e., (meth)acrylic acid alkyl ester monomers) include linear or branched monofunctional acrylates or methacrylates of non-tertiary alkyl alcohols, the alkyl groups of which have from 1 up to 22 and, in particular, from 1 up to 18 carbon atoms. Useful monomers include, for example, 2-ethylhexyl (meth)acrylate, ethyl (meth)acrylate, methyl (meth)acrylate, n-propyl (meth)acrylate, isopropyl (meth)acrylate, pentyl (meth)acrylate, n-octyl (meth)acrylate, isooctyl (meth)acrylate, isononyl (meth)acrylate, n-butyl (meth)acrylate, isobutyl (meth)acrylate, hexyl (meth)acrylate, n-nonyl (meth)acrylate, isoamyl (meth)acrylate, n-decyl (meth)acrylate, isodecyl (meth)acrylate, dodecyl (meth)acrylate, isobornyl (meth)acrylate, cyclohexyl (meth)acrylate, isostearyl (meth)acrylate, behenyl (meth)acrylate, and 2-methylbutyl (meth)acrylate, and combinations thereof.

For certain embodiments, suitable (meth)acrylic ester monomers include, but are not limited to, those selected from the group consisting of the esters of acrylic acid or methacrylic acid with non-tertiary alkyl alcohols such as 1-butanol, 1-pentanol, 2-pentanol, 3-pentanol, 2-methyl-1-butanol, 1-methyl-1-butanol, 1-methyl-1-pentanol, 2-methyl-1-pentanol, 3-methyl-1-pentanol, 2-ethyl-1-butanol, 2-ethyl-1-hexanol, 3,5,5-trimethyl-1-hexanol, 3-heptanol, 2-octanol, 1-decanol, 1-dodecanol, and the like, and mixtures thereof.

Suitable high refractive index monomers, which typically include an aromatic group, include 2-phenoxyethyl acrylate (available under the trade name SR339, Sartomer USA, LLC, Exton, Pa.), 2-(phenylthio)ethyl acrylate (Cytec Ind., Woodland, N.J.), 2-phenylphenoxyethyl acrylate (Double Bond Chemical Ind. Co., Taipei, Taiwan) and 2-propenoic acid (3-phenoxyphenyl)methyl ester (Miwon Chemical Co., Korea), ethoxylated bisphenol A diacrylates (available under the trade names SR601, SR602, and SR349 from Sartomer USA, LLC) and EM2261 and EM2263 from Eternal Chemical Co., Kaosiung, Taiwan), ethoxylated bisphenyl fluorene diacrylates and its blend with diluents (available under the trade names HR6040, HR6042, and HR6060 from Miwon Chemical Co., Korea, and EM2206 from Eternal Chemical Co. Kaosiung, Taiwan), and other monomers such as that available under the trade name DM R1610 from Double Bond Chemical Ind. Co. Taipei, Taiwan). High refractive index monomers also include 2-biphenyl acrylate, 2-biphenyl ethyl acrylate, 2-biphenyl hexyl acrylate, and 2-benzyl acrylate, which can be halogenated or not.

Polar monomers include free-radically copolymerizable monomers such as acrylic monomers containing hydroxyl, carboxylic acid, amide, urethane, or urea functional groups.

Useful carboxylic acids include acrylic acid and methacrylic acid.

Monomers like N-vinyllactams may also be included.

Useful amides include N-vinyl caprolactam, N-vinyl pyrrolidone, (meth)acrylamide, N-methyl (meth)acrylamide, N,N-dimethyl meth(acrylamide), N-isopropyl (meth)acrylamide and N-octyl (meth)acrylamide.

Specialty sulfur-containing resins may be used in the polymerizable acrylate matrix. Such resins include, for example, bis(4-methacryloylthiophenyl)sulfide, bis[4-(2,3-epoxypropylthio)phenyl]sulfide, and 1,1'-thiobis[4-(ethenylthio)methyl]-benzene from Sumitomo SeiKa Chemicals Co., Japan.

Suitable acrylate oligomers include bisphenol A epoxy diacrylate (available under the trade names CN120 and CN104, Sartomer USA, LLC, Exton, Pa.), epoxy acrylate oligomer (available under the trade name DM 156, Double Bond Chemical Ind. Co., Taipei, Taiwan).

In this context, an oligomer includes a plurality of monomeric repeat units, wherein the oligomer has a degree of polymerization resulting in a material with a molecular weight below the entanglement molecular weight of the composition making up the oligomer. In contrast, a polymer includes a plurality of monomeric repeat units, wherein the polymer has a degree of polymerization resulting in a molecular weight that exceeds the entanglement molecular weight of the composition making up the polymer.

Suitable acrylate-derived oligomeric or polymeric groups attached to inorganic nanoparticles include those derived from the acrylate monomers listed above. The oligomeric or polymeric groups attached to inorganic nanoparticles can be formed by initiation and chain-growth from free-radical initiators anchored on the inorganic nanoparticles, as described herein (i.e., a "grow from" technique). Alternatively or additionally, they can be formed by free-radical polymerization of the acrylate monomers listed above in the presence of nanoparticles containing chain transfer groups (e.g., mercaptans) (i.e., a "graft to" technique).

In certain embodiments, a polymerized acrylate matrix includes aromatic groups, such as those derived from the high refractive index monomers described above.

In certain embodiments, the polymerized acrylate matrix further includes bromide, phosphorous, N-hydroxyurea, or sulfur groups. Such groups are typically present in monomers that can be used in making the acrylate matrix such as the following:

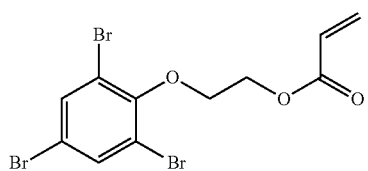 [SMILES: C=CC(=O)OCCOc1c(Br)cc(Br)cc1Br]

(2-(2,4,6-tribromophenoxy)ethyl acrylate),

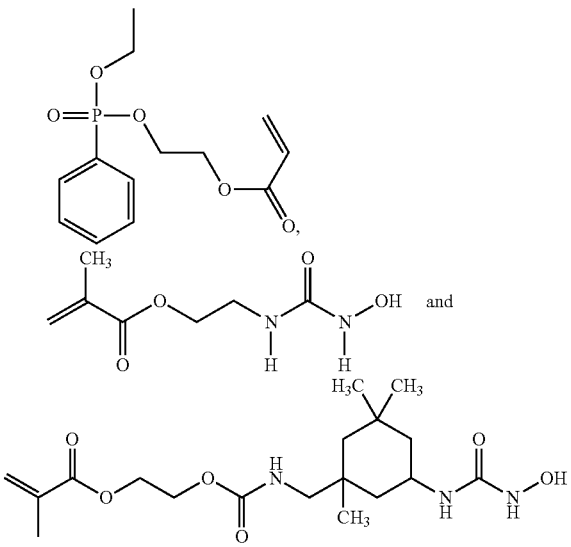

(described in U.S. Patent Application Publication No. 2011/0126734), and

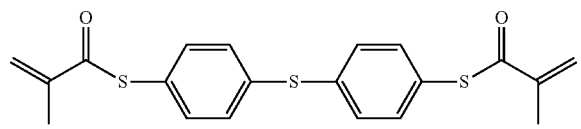 [SMILES: C=C(C)C(=O)Sc1ccc(Sc2ccc(SC(=O)C(=C)C)cc2)cc1]

commercially available from Sumitomo SeiKa Chemicals Co., Japan, and bis[4-(acryloyloxy ethoxy)phenyl sulfide (TO-2066, available from Toagosei, JP).

Significantly, N-hydroxyurea functional groups can promote adhesion of the polymerized acrylate matrix to certain substrates, like glass, ITO-patterned glass, unprimed polyester (PET), and cyclo-olefin copolymers.

For certain embodiments, the acrylate matrix of the present disclosure can be made using the methods according to U.S. Patent Application Publication Nos. 2010/0222496 and 2009/0105437. The acrylate matrix can be derived from a combination of high refractive index monomers, such as 2-(phenylthio)ethyl acrylate, 2-phenylphenoxyethyl acrylate, 2-propenoic acid (3-phenoxyphenyl)methyl ester, 2-biphenyloxy hexyl acrylate, 2-(2,4,6-tribromophenoxy)ethyl acrylates, and other aromatic acrylate monomer (for example, CD 590, available from Sartomer USA, LLC) and optionally a lower index monomer, such a 2-ethylhexyl acrylate, isooctylacrylate, n-butylacrylate, and isobornyl acrylate. These lower index monomers are typically used at lower levels in the high index acrylate composition. For example, they can be used at levels less than 30 parts per hundred parts by weight of the acrylate matrix composition, or less than 20 parts per hundred parts by weight of the acrylate matrix composition. Higher levels typically cause a rapid drop in the overall refractive index of the composition. However, these lower index monomers can be used to adjust the overall rheology or the acrylate matrix. For example isobornyl acrylate can be used to increase the Tg and make the adhesive non-tacky, for example to get heat-activatable properties. Monomers like n-butylacrylate, isooctylacrylate, or 2-ethylhexyl acrylate can be used to increase tackiness because they provide a lower Tg and lower modulus to the acrylate matrix composition.

For certain embodiments, a polymer grafted on the nanoparticles can be derived from high refractive index (e.g., an index of refraction of at least 1.55) mono-acrylates that as a homopolymer yield low Tg (less than 30° C.). Such mono-acrylates include 2-(phenylthio)ethyl acrylate, 2-phenylphenoxyethyl acrylate, 2-propenoic acid (3-phenoxyphenyl) methyl ester, 2-biphenyloxy hexyl acrylate, 2-(2,4,6-tribromophenoxy)ethyl acrylates, and other aromatic acrylate monomer (CD 590, available from Sartomer USA, LLC). These lower Tg yielding monomers can provide tackiness to the polymer grafted onto the particle, thus allowing for the grafted particles by themselves to be tacky and show some adhesiveness.

The polymer grafted on the nanoparticles may also be derived from high refractive index and high Tg yielding mono-acrylates such as carbazole ethyl acrylate and naphthyl(thio)oxyalkyl acrylates monomers. These monomers may be combined with low refractive index and low Tg yielding acrylate monomers such as isooctyl acrylate, 2-ethylhexyl acrylate, ethoxylated (4) nonyl phenol acrylate (SR504, available from Sartomer USA, LLC), and caprolactone acrylates (SR495B, available from Sartomer USA, LLC). Typically, the low refractive index monomer content in the polymer grafted on the nanoparticles are used at lower concentration, such as less than 20 parts by weight per hundred parts of the monomers used to make the polymer on the particles.

For certain embodiments, a (meth)acrylate copolymer having pendant (meth)acryloyl groups and optional pendant hydroxyl groups can be formed from two or more different types of (meth)acrylate monomers (i.e., acrylate and/or methacrylate monomers). In an uncured state, such copolymer may have a weight average molecular weight of 100,000 Daltons to 400,000 Daltons and an average distance between (meth)acryloyl groups equal to at least 14,000 Daltons. These copolymers are described in Applicant's Application entitled "ADHESIVE INCLUDING PENDANT (METH)ACRYLOYL GROUPS, ARTICLE, AND METHOD", Provisional Application Ser. No. 61/727,384, filed on Nov. 16, 2012.

In certain embodiments, the (meth)acrylate copolymer having pendant (meth)acryloyl groups and optional pendant hydroxyl groups can be derived from one or more (meth) acrylic ester monomers (e.g., to control modulus and Tg of the final material), and one or more copolymerizable polar monomers, and optionally, one or more other monomers.

In certain embodiments, the (meth)acrylate copolymer having pendant (meth)acryloyl groups and optional pendant hydroxyl groups can be derived from at least 50 parts by weight of a (meth)acrylic ester monomer, and at least 0.1 part by weight a copolymerizable polar monomer. In certain embodiments, the (meth)acrylate copolymer having pendant (meth)acryloyl groups and optionally pendant hydroxyl groups can be derived from no greater than 95 parts by weight of a (meth)acrylic ester monomer, and no greater than 50 parts by weight of a copolymerizable polar monomer. Other optional monomers can be used in an amount of 0 to 30 parts by weight.

The (meth)acrylate monomers (i.e., (meth)acrylic acid ester monomers) for preparing a (meth)acrylate copolymer having pendant (meth)acryloyl groups and optional pendant hydroxyl groups can include aliphatic, cycloaliphatic, or aromatic groups. Useful (meth)acrylate monomers include linear or branched monofunctional acrylates or methacrylates of non-tertiary alkyl alcohols, the alkyl groups of which have from 1 up to 22 and, in particular, from 1 up to 18 carbon atoms. Useful monomers include, for example, 2-ethylhexyl (meth)acrylate, ethyl (meth)acrylate, methyl (meth)acrylate, n-propyl (meth)acrylate, isopropyl (meth) acrylate, pentyl (meth)acrylate, n-octyl (meth)acrylate, isooctyl (meth)acrylate, isononyl (meth)acrylate, n-butyl (meth)acrylate, isobutyl (meth)acrylate, hexyl (meth)acrylate, cyclohexyl (meth)acrylate, n-nonyl (meth)acrylate, iso-amyl (meth)acrylate, n-decyl (meth)acrylate, isodecyl (meth)acrylate, dodecyl (meth)acrylate, isobornyl (meth) acrylate, isostearyl (meth)acrylate, behenyl (meth)acrylate, and 2-methylbutyl (meth)acrylate, and combinations thereof.

Other useful (meth)acrylate monomers making a (meth) acrylate copolymer having pendant (meth)acryloyl groups and optional pendant hydroxyl groups include an aromatic group, include 2-phenoxyethyl acrylate (available under the trade name SR339, Sartomer USA, LLC), 2-(phenylthio) ethyl acrylate (Cytec Ind., Woodland, N.J.), 2-phenylphenoxyethyl acrylates (Double Bond Chemical Ind. Co., Taipei, Taiwan), propionic acid (3-phenoxyphenyl)methyl ester (Miwon Chemical Co., Korea), and combinations thereof.

Other high refractive index monomers as described herein can be used to make a (meth)acrylate copolymer having pendant (meth)acryloyl groups and optional pendant hydroxyl groups.

Useful polar monomers for making a (meth)acrylate copolymer having pendant (meth)acryloyl groups and optional pendant hydroxyl groups typically include hydroxyl and/or carboxylic acid functionality, although other functional groups such as urethane, urea, or amide functionality can be useful as well.

Useful acid-functional monomers include acrylic acid, methacrylic acid, itaconic acid, and combinations thereof. Anhydrides, such as maleic anhydride and methacrylic acid anhydride can also be used.

Useful hydroxyl-functional monomers typically have a hydroxyl equivalent weight of less than 400. The hydroxyl equivalent molecular weight is defined as the molecular weight of the monomeric compound divided by the number of hydroxyl groups in the monomeric compound. Useful monomers of this type include 2-hydroxyethyl acrylate and methacrylate, 3-hydroxypropyl acrylate and methacrylate, 2-hydroxypropyl acrylate and methacrylate, 4-hydroxybutyl acrylate and methacrylate, 2-hydroxyethylacrylamide, and 3-hydroxypropylacrylamide. Additionally, hydroxyl functional monomers based on glycols derived from ethylenoxide or propyleneoxide can also be used. An example of this type of monomer includes a hydroxyl terminated polypropylene glycol acrylate, available under the trade name BISOMER PPA 6 from Cognis, Germany Various combinations of such monomers can be used, if desired.

Other optional monomers for making a (meth)acrylate copolymer having pendant (meth)acryloyl groups and optional pendant hydroxyl groups include (meth)acrylamide, N-isopropyl (meth)acrylamide, N,N-dimethyl (meth) acrylamide, N-octyl acrylamide, N,N-dimethylaminoethyl methacrylate, N-vinyl pyrrolidone, N-morpholino acrylate, diacetone (meth)acrylamide, N-vinyl lactams, vinyl esters (such as vinyl acetate), styrene, as well as high Tg macromers, such as those based on polymethylmethacrylate or polystyrene.

In certain embodiments for a making (meth)acrylate copolymer having pendant (meth)acryloyl groups and optional pendant hydroxyl groups, the (meth)acrylate monomer is selected from 2-ethylhexyl (meth)acrylate, methyl (meth)acrylate, ethyl (meth)acrylate, n-butyl (meth)acrylate, isobutyl (meth)acrylate, cyclohexyl (meth)acrylate, hexyl (meth)acrylate, n-octyl (meth)acrylate, isooctyl (meth)acrylate, isononyl (meth)acrylate, isobornyl (meth)acrylate, isostearyl (meth)acrylate, behenyl (meth)acrylate, 2-methylbutyl (meth)acrylate, and combinations thereof.

In certain embodiments for making a (meth)acrylate copolymer having pendant (meth)acryloyl groups and optional pendant hydroxyl groups, the polar monomer is a hydroxyl-functional monomer selected from 2-hydroxyethyl acrylate and methacrylate, 3-hydroxypropyl acrylate and methacrylate, 2-hydroxypropyl acrylate and methacrylate, 4-hydroxybutyl acrylate and methacrylate, 2-hydroxyethylacrylamide, 3-hydroxypropylacrylamide, and combinations thereof.

In certain embodiments for making a (meth)acrylate copolymer having pendant (meth)acryloyl groups and optional pendant hydroxyl groups, the optional monomers are selected from (meth)acrylamide, N-isopropyl (meth) acrylamide, N-morpholino acrylate, diacetone (meth)acrylamide, vinyl acetate, styrene, and combinations thereof.

Copolymers without the pendant (meth)acryloyl groups can be made under adiabatic conditions, as is disclosed in U.S. Pat. No. 5,637,646 (Ellis) and U.S. Pat. No. 5,986,011 (Ellis et al.) or by conventional solution polymerization.

An indirect, but preferred, method of incorporating pendant (meth)acryloyl groups into the copolymer is to include among the monomer units of the copolymer some that include a reactive functional group as described above in the polar monomers. These pendant reactive functional groups are reacted with unsaturated compounds that include functional groups that are co-reactive with the reactive pendant functional group. When the two functional groups react, a molecule with pendant unsaturation results, i.e., the resulting copolymer will have pendant (meth)acryloyl groups. Generally, the reaction is between nucleophilic and electrophilic functional groups that react by a ring opening, addition, or condensation mechanism.

Using this "indirect method" of incorporating the pendant, free-radically polymerizable functional groups, preferred reactive functional groups include hydroxyl and acid groups. Where the pendant reactive functional group includes a hydroxyl group, the co-reactive functional group preferably includes a carboxylic acid, isocyanato, epoxy, or anhydride group. Where the pendant reactive functional group includes a carboxylic acid group, the co-reactive functional group preferably comprises a hydroxyl, amino, epoxy, isocyanate, aziridine, azetidine, or oxazolinyl group. When the pendant group includes an anhydride, the co-reactive group can be hydroxyl or amine group.

In certain embodiments, the pendant (meth)acryloyl groups can be formed from the reaction between a hydroxyl group in the copolymer and isocyanatoethyl acrylate or methacrylate. In certain embodiments, the pendant (meth) acryloyl groups can be formed from the reaction between a carboxylic acid in the copolymer with glycidyl acrylate or methacrylate.

In yet another embodiment the pendant (meth)acryloyl group can be formed between an anhydride group in the acrylic copolymer and a hydroxyl functional monomer, such as 2-hydroxethyl acrylate or methacrylate.

A polymerizable acrylate matrix of the present disclosure will typically need to be compounded with an initiator to cure using, e.g., UV radiation or heat. Thus, in certain embodiments, an adhesive that includes a (meth)acrylate copolymer of the present disclosure also includes an initiator. Suitable initiators are free-radical initiators (i.e., free-radical generating initiator), such as thermal initiators or photoinitiators. Various combinations of initiators can be included in adhesives of the present disclosure.

Examples of thermal initiators include various peroxides such as benzoyl peroxide, cyclohexane peroxide, lauroyl peroxide, di-tert-amyl peroxide, tert-butyl peroxy benzoate, di-cumyl peroxide, and peroxides commercially available from Arkema, Inc., (King of Prussia, Pa.) under the trade designation LUPERSOL (e.g., LUPERSOL 101, which is 2,5-bis(tert-butylperoxy)-2,5-dimethylhexane, and LUPERSOL 130, which is 2,5-dimethyl-2,5-di-(tert-butylperoxy)-3-hexyne); various hydroperoxides such as tert-amyl hydroperoxide and tert-butyl hydroperoxide; and azo compounds such as those available under the trade name VAZO (from E.I. du Pont de Nemours and Co. Wilmington, Del.) including VAZO 67, which is 2,2'-azobis(2-methylbutane nitrile), VAZO 64, which is 2,2'-azobis(isobutyronitrile), VAZO 52, which is (2,2'-azobis(2,4-dimethylpentanenitrile), and VAZO 88, which is 1,1'-azobis(cyclohexanecarbonitrile); and V-601 (from Wako Specialty Chemicals, Richmond, Va., which is dimethyl-2,2'-azobisisobutyrate).

Examples of photoinitiators include those available under the trade names IRGACURE 651 (from Ciba Chemicals, Tarrytown, N.Y., which is 2,2-dimethoxy-2-phenylacetophenone), LUCIRIN TPO-L (from BASF Corp.), and IRGACURE 184 (from Ciba Specialty Chemicals, which is 1-hydroxycyclohexyl phenyl ketone).

The polymerized acrylate matrix with optional inorganic nanoparticles dispersed therein can be inherently tacky. If desired, tackifiers can be added to the polymerized acrylate matrix with optional inorganic nanoparticles dispersed therein. Useful tackifiers include, for example, rosin ester resins, aromatic hydrocarbon resins, aliphatic hydrocarbon resins, and terpene resins. In general, light-colored tackifiers selected from hydrogenated rosin esters, terpenes, or aromatic hydrocarbon resins can be used. Low molecular weight (e.g., 50,000 Daltons or less for Mw by GPC) and high Tg (e.g., greater than 30° C.) polymers derived from (meth)acrylates can also be used as tackifiers. For example, such tackifiers are described in U.S. Pat. Nos. 6,783,850 and 6,939,911. Aromatic tackifiers are generally preferred because of their higher refractive index.

Other materials can be added to the polymerized acrylate matrix with optional inorganic nanoparticles dispersed therein of the present disclosure for special purposes, including, for example, oils, plasticizers, antioxidants, UV stabilizers, pigments, curing agents, chain-transfer agents, polymer additives, and other additives. In certain embodiments, it is desired that such additives do not significantly reduce the optical clarity and the refractive index of the adhesive. The identity and relative amounts of such optional components are well known to those skilled in the art.

For example, antioxidants and/or stabilizers such as hydroquinone monomethyl ether (p-methoxyphenol, MeHQ), and that available under the trade name IRGANOX1010 (tetrakis(methylene(3,5-di-tert-butyl-4-hydroxyhydrocinnamate))methane), from BASF, can be mixed into the (meth)acrylate copolymer to increase its temperature stability. If used, an antioxidant and/or stabilizer is typically used in the range of 0.01 percent by weight (wt-%) to 1.0 wt-%, based on the total weight of copolymer.

Chain-transfer agents which are well known in the polymerization art may also be included to control the molecular weight or other polymer properties. Suitable chain-transfer agents include, but are not limited to, those selected from the group of carbon tetrabromide, hexanebromoethane, bromotrichloromethane, 2-mercaptoethanol, t-dodecylmercaptan, isooctylthioglycoate, 3-mercapto-1,2-propanediol, cumene, pentaerythritol tetrakis (3-mercapto butyrate) (available under the trade name Karenz MT PEI from Showa Denko), ethylene glycol bisthioglycolate, and mixtures thereof. Depending on the reactivity of a particular chain-transfer agent and the amount of chain transfer desired, 0 to 5 wt-% can be used, based upon the total weight of monomer(s).

A polymerizable acrylate matrix can be used to make a polymerized acrylate matrix on a liner for use in a laminating process for application of a substrate having an electro-conductive trace. Alternatively, a polymerizable acrylate matrix can be applied directly to a substrate having an electro-conductive trace using a coating process.

In many cases, free-radical polymerization of the monomers for preparation of the polymerized acrylate matrix with optional inorganic nanoparticles dispersed therein of the present disclosure can take place without solvents, i.e., true bulk polymerization where the copolymer formed, as well as the monomers themselves, are all miscible. However, the monomers may in some cases require a solvent. A suitable solvent is one that is miscible with all the other components of the coating composition. By this it is meant that the, composition remains homogeneous in diluted form and during drying such that there is no separation of the components out of the solvent, e.g., no nanoparticle agglomeration or larger phase separation of the components. Also, a suitable solvent is one that dries quickly enough during coating process to allow for curing of the coating. And, a suitable solvent is one that does not damage the substrate to which the coating composition is applied (for example, it cannot cause crazing of a polymer film). Exemplary solvents include methyl ethyl ketone, methyl isobutyl ketone, 1-methoxy-2-propanol, isopropyl alcohol, toluene, ethyl acetate, butyl acetate, acetone, and the like, and mixtures thereof. If used, such solvents are present in an amount less than 10 wt-%, and often in an amount of less than 5 wt-%, based on the total weight of the reaction mixture. Such solvent is typically removed prior to use of the polymerized acrylate matrix.

Inorganic Nanoparticles

In certain embodiments, the acrylate matrix (whether polymerized or polymerizable) has inorganic nanoparticles dispersed therein. Such nanoparticles provide a means to boost the refractive index of the composite material, since their refractive index is typically higher than the refractive index of the acrylate matrix.

Useful inorganic nanoparticles are of a size (average particle size, which is the largest dimension of a particle, e.g., a diameter of a spherical particle or the length of a rod) of no greater than 150 nanometers (nm), preferably no greater than 20 nm. They may or may not have surface modification (i.e., include functional groups, oligomers or polymers on the surface of the nanoparticles).

In certain embodiments, the inorganic nanoparticles, without surface modification, possess a relatively high index of refraction. In certain embodiments, the inorganic nanoparticles, without surface modification, have an index of refraction of at least 1.8.

Surface modification of the inorganic nanoparticles with organic materials can reduce the index of refraction of the nanoparticles. This is especially true if the surface modifier is low in refractive index and is a high in volume percentage relative to the core inorganic particle. Thus, typically higher refractive index modifiers are preferred, for example, those that include aromatic moieties, as opposed to aliphatic moieties.

When surface-modified nanoparticles are added to the composition, their preferred refractive index is at least 1.6, or at least 1.65, or at least 1.70. These nanoparticles are typically derived from antimony tin oxide, zirconiumdioxide, titanium dioxide, or zinc oxide.

Representative examples of such high refractive index nanoparticles include zirconia ($ZrO_2$), titania ($TiO_2$), zinc sulfide (ZnS), antimony oxides (e.g., antimony tin oxide), zinc oxide (ZnO), tin oxides (e.g., indium tin oxide), alone or in combination (including mixed metal oxides). Zirconias for use in the coating composition are available from Nalco Chemical Co. under the trade name NALCO OOSSOO8, and from Buhler AG Uzwil, Switzerland under the trade name BUHLER zirconia Z—WO sol. Zirconia nanoparticles can also be prepared as described in U.S. Patent Application Publication No. 2006/0148950 and U.S. Pat. No. 6,376,590.

In certain embodiments, the inorganic nanoparticles include zirconia, titania, ZnS, ZnO, tin oxides, antimony oxides, or combinations thereof.

In certain embodiments, the inorganic nanoparticles include one or more surface modifiers and are referred to herein as surface-modified inorganic nanoparticles. Such modifiers can have functional groups that act as anchoring groups for the remainder of the surface modifier molecules. Alternatively, such functional groups may provide the surface modification themselves.

Examples of surface modifiers include various functional groups known to modify the surface properties of nanoparticles (e.g., silane functional groups, N-hydroxyurea functional groups, acid functional groups), and may have additional groups that may be reactive with components of the acrylate matrix.

In certain embodiments, a surface-modified inorganic nanoparticle includes a surface modifier that includes, for example, silane functionality, N-hydroxyurea functionality, acid functionality, or combinations thereof.

Representative examples of silane functionality (i.e., functional groups) can be provided by functionalizing the nanoparticles using compounds such as the following: isooctyl trimethoxy-silane, N-(3-triethoxysilylpropyl)methoxyethoxyethoxyethyl carbamate, N-(3-triethoxysilylpropyl) methoxyethoxyethoxyethyl carbamate, 3-(methacryloyloxy) propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl) methyldimethoxysilane, 3-(methacryloyloxy)propyldimethylethoxysilane, 3-(methacryloyloxy) propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy)silane, styrylethyltrimethoxysilane, mercaptopropyltrimethoxysilane, 3-glycidoxypropyltrimethoxysilane, phenyltrimethoxysilane, and mixtures thereof.

Representative examples of N-hydroxyurea functionality (i.e., functional groups) can be provided by functionalizing the nanoparticles using compounds such as the following:

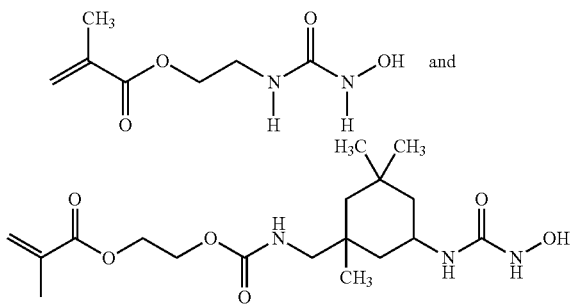

(described in U.S. Patent Application Publication No. 2011/0126734). Significantly, N-hydroxyurea functional groups can promote adhesion of the polymerized acrylate matrix to certain substrates, like glass, ITO-patterned glass, unprimed polyester, and cyclo-olefin copolymers. It is preferred, however, that such groups be part of one or more monomers used in making the acrylate matrix, rather than functional groups on the particles.

Representative examples of acid functionality (i.e., functional groups) can be provided by functionalizing the nanoparticles using compounds such as the following: acrylic acid, methacrylic acid, oleic acid, stearic acid, dodecanoic acid, 2-[2-(2-methoxyethoxy)ethoxy]acetic acid (MEEAA), beta-carboxyethylacrylate (BCEA), 2-(2-methoxyethoxy) acetic acid, methoxyphenyl acetic acid, and mixtures thereof.

Such groups may function as anchoring groups for groups reactive with, for example, components of a polymerizable acrylate matrix, as described herein. Reactive surface modifiers include, for example, groups that can copolymerize with the components of the acrylate matrix (such as vinyl, allyl, or (meth)acrylate), chain transfer groups or photoinitiator groups. Such chain transfer or initiator groups may be used to either graft or grow oligomeric surface modifiers on the nanoparticles (e.g., (meth)acrylate or (meth)acrylamide oligomers). These types of surface modifiers ((meth)acrylate or (meth)acrylamide oligomers) not only can aid in the dispersibility of the nanoparticles in the acrylate matrix, but in some embodiments they can form the acrylate matrix by themselves. The oligomers may or may not be crosslinkable, for further reaction after polymerization and deposition on the substrate either through coating or lamination.

Nanoparticles carrying initiator groups in the surface modifiers can be used to initiate the polymerization reactions of the polymerizable acrylate matrix (e.g., (meth)acrylate monomers). Nanoparticles carrying chain transfer groups in the surface modifiers can be used to grow components of the polymerizable acrylate matrix (e.g., (meth)acrylate monomers) by grafting.

An example of a chain transfer group includes the thiol group from 3-mercaptopropyltrimethoxysilane.

An example of a photoinitiator group includes the reaction product of DAROCUR 2959 photoinitiator and isocyanatopropyl trimethoxysilane, where the DAROCUR 2959 forms the initiator group and the silane is the anchoring group to the nanoparticle surface.

Methods of adding such functional groups to a nanoparticle surface are generally well known to those skilled in the art.

Various combinations of inorganic nanoparticles, with or without surface modification, may be used in the present disclosure.

Generally, if used, the inorganic nanoparticles are present in an acrylate matrix (whether polymerized or polymerizable) in an amount of no greater than 60 volume percent (vol-%). Generally, if used, the inorganic nanoparticles are present in an acrylate matrix (whether polymerized or polymerizable) in an amount of at least 1 vol-%.

If used in combination with a polymerized acrylate matrix with a relatively low index of refraction (e.g., an index of refraction of less than 1.55), the inorganic nanoparticles are present in an acrylate matrix (whether polymerized or polymerizable) in an amount of no greater than 60 volume percent (vol-%). If used in combination with a polymerized acrylate matrix with a relatively low index of refraction, the inorganic nanoparticles are present in an acrylate matrix (whether polymerized or polymerizable) in an amount of at least 5 vol-%.

Although not necessarily needed, if used in combination with a polymerized acrylate matrix with a relatively high index of refraction (e.g., an index of refraction of 1.55 and higher), the inorganic nanoparticles are present in an acrylate matrix (whether polymerized or polymerizable) in an amount of no greater than 60 volume percent (vol-%). If used in combination with a polymerized acrylate matrix with a relatively high index of refraction, the inorganic nanoparticles are present in an acrylate matrix (whether polymerized or polymerizable) in an amount of at least 1 volume percent (vol-%), or at least 1 vol-%, or at least 10 vol-%, or at least 20 vol-%.

Methods and Uses

In certain embodiments, acrylate matrices of the present disclosure are optically clear. Thus, certain articles can be laminates that include an optically clear substrate (e.g., a film) and an optically clear polymerized acrylate matrix to at least one major surface of the optical film or substrate. The articles can further include another substrate (e.g., permanently or temporarily attached to the polymerized acrylate matrix of the present disclosure), another adhesive layer, or a combination thereof.

In embodiments of laminates in which an optically clear polymerized acrylate matrix layer is positioned between two substrates, at least one of the substrates is an optical film, a display (emissive or reflective, such as OLED or LCD), or a lens (e.g., glass, polymethymethacrylate, or polycarbonate). Optical films intentionally enhance, manipulate, control, maintain, transmit, reflect, refract, absorb, retard, or otherwise alter light that impinges upon a surface of the film. Films included in the laminates include classes of material that have optical functions, such as polarizers, interference polarizers, reflective polarizers, diffusers, colored optical films, mirrors, louvered optical film, light control films, transparent sheets, brightness enhancement film, anti-glare, and anti-reflective films, and the like. Films for the provided laminates can also include retarder plates such as quarter-wave and half-wave phase retardation optical elements. Other optically clear films include anti-splinter films and electromagnetic interference filters. The films may also be used as substrates for ITO coating or patterning, such as use those used for the fabrication of touch sensors.

In some embodiments, the resulting laminates can be optical elements or can be used to prepare optical elements. As used herein, the term "optical element" refers to an article that has an optical effect or optical application. The optical elements can be used, for example, in electronic displays, architectural applications, transportation applications, projection applications, photonics applications, and graphics applications. Suitable optical elements include, but are not limited to, glazing (e.g., windows and windshields), screens or displays, cathode ray tubes, ITO-coated touch sensors such as those using glass or clear plastic substrates, and reflectors.

The material of the acrylate matrix can be applied to a patterned substrate in a number of ways. It can be applied using a laminate that includes a polymerized acrylate matrix, as for example, demonstrated by FIG. 2. Alternatively, it can be applied out of a coating composition that includes a polymerizable acrylate matrix.

In one embodiment, the method of making an article includes: providing a patterned substrate comprising a substrate surface with an inorganic electro-conductive trace adjacent thereto, wherein the substrate and the inorganic material of the trace each has an index of refraction; and applying a polymerized acrylate matrix (optionally having inorganic nanoparticles dispersed therein) to at least a portion of the patterned substrate surface; wherein the polymerized acrylate matrix has an index of refraction that is within ±10% of the average of the indices of refraction of the substrate and the inorganic material of the trace.

In certain embodiments, applying a polymerized acrylate matrix includes applying a laminate, wherein the laminate includes: a layer including an optically clear adhesive; and a layer including a high index polymerized acrylate matrix (optionally having inorganic nanoparticles dispersed therein) adjacent to the optically clear adhesive layer. Upon applying to the patterned substrate, the laminate is positioned such that the high index polymerized acrylate matrix is disposed between the patterned substrate surface and the optically clear adhesive.

A laminate can be applied using a conventional technique, including roller, vacuum lamination, or combination thereof. A laminate is typically applied under ambient conditions but may also be applied under conditions of elevated temperature (e.g., 60-70° C.). To finalize the assembly an autoclave step may be used, as is known in the art. After the laminate is applied, an additional curing step using energy (e.g., light or heat) may be applied to crosslink the acrylate matrix or to increase the crosslinking of the acrylate matrix.

The laminate can be made using a coating technique that includes roll coating, spray coating, knife coating, die coating, and the like. For example, a standard (or "regular") OCA layer of a transfer tape can be coated with a high refractive index polymerizable acrylate matrix (optionally having inorganic nanoparticles dispersed therein), after peeling off a release liner, e.g., an easy release liner, of the transfer tape. After drying and polymerization, the high refractive index coating can be protected by laminating another release liner to its surface, before or after polymerization. Another method that can be used to make the laminate includes coating a release liner, e.g., a tight release liner, with a high refractive index polymerizable acrylate matrix (optionally having inorganic nanoparticles dispersed therein), polymerizing the coating, followed by thy-laminating a standard OCA transfer tape on the high refractive index coating, after removing a release liner of the transfer tape. The release liner adjacent to the polymerized acrylate matrix may be a tight release liner or an easy release liner.

Typically, the coating composition for making a laminate includes a polymerizable acrylate matrix, optionally an initiator, and a solvent. The laminate can also be made by coating the polymerized acrylate composition and a standard solvent based OCA using slide-die coating or dual layer die coating techniques on a release liner, followed by drying and curing.

In an embodiment that involves a coating method on a patterned substrate, the method includes: providing a patterned substrate that includes a substrate surface with an inorganic electro-conductive trace adjacent thereto, wherein the substrate and the inorganic material of the trace each has an index of refraction; applying a coating composition to at least a portion of the patterned substrate surface to form a coated surface, wherein the coating composition includes a polymerizable acrylate matrix (optionally having inorganic nanoparticles dispersed therein); and polymerizing the polymerizable acrylate matrix to form a layer including a polymerized acrylate matrix; wherein the polymerized acrylate matrix has an index of refraction that is within ±10% of the average of the indices of refraction of the substrate and the inorganic material of the trace. In certain embodiments, the method further includes applying an optically clear adhesive on the coated surface, wherein polymerizing the polymerizable acrylate matrix occurs before or after applying the optically clear adhesive.

In one embodiment, a method of coating is provided that includes: providing a patterned substrate that includes a substrate surface with an inorganic electro-conductive trace adjacent thereto; applying a coating composition to at least a portion of the patterned substrate surface to form a coated surface; and polymerizing the polymerizable acrylate matrix to form a layer that includes a polymerized acrylate matrix. In this method, the coating composition includes: a polymerizable acrylate matrix that includes N-hydroxyurea functional groups; inorganic nanoparticles dispersed in the polymerizable acrylate matrix; and an initiator. In certain embodiments, the weight percentage of N-hydroxyurea functional groups is at least 0.5 wt-% of the coating. In certain embodiments, the method further includes applying an optically clear adhesive on the coated surface, wherein polymerizing the polymerizable acrylate matrix occurs before or after applying the optically clear adhesive.

In such embodiments, the N-hydroxyurea functional groups promote adhesion of the polymerized acrylate matrix to substrates such as glass, ITO-patterned glass, unprimed PET, and cyclo-olefin (COP) polymers. Such substrates are known to be difficult to adhere to, so primers are often used to promote adhesion.

Typically, a coating composition that includes a polymerizable acrylate matrix (for use in making a laminate and for coating on a patterned substrate) also includes an initiator. Suitable initiators are free-radical initiators, e.g., those that can be activated by thermal or actinic radiation. In certain embodiments, a coating composition that includes a polymerizable acrylate matrix (for coating on a patterned substrate) also includes a solvent, as described herein. In some embodiments (for example polymer grafted nanoparticles), no additional polymerization step is required and the polymer grafted particles may be coated without solvent or with solvent, as described herein, and dried. Optionally, the coating may be crosslinked by exposure to heat or radiation.

Illustrative coating techniques include roll coating, spray coating, knife coating, die coating, and the like. A coating composition is typically applied under ambient conditions but may also be applied under conditions of elevated temperature (e.g., 60-70° C.). To finalize the assembly an autoclave step may be used, as is known in the art.

Illustrative Embodiments

1. An article comprising:
    a patterned substrate comprising a substrate surface with an inorganic electro-conductive trace adjacent thereto, wherein the substrate and the inorganic material of the trace each has an index of refraction; and
    a layer comprising a polymerized acrylate matrix adjacent to at least a portion of the surface of the substrate and the inorganic electro-conductive trace, wherein the polymerized acrylate matrix has an index of refraction that is within ±10% of the average of the indices of refraction of the substrate and the inorganic material of the trace.
2. The article of embodiment 1 wherein the polymerized acrylate matrix comprises inorganic nanoparticles dispersed therein.
3. The article of embodiment 2 wherein the inorganic nanoparticles are present in the polymerized acrylate matrix in an amount of no greater than 60 volume percent.
4. The article of embodiment 1 or 2 wherein the inorganic nanoparticles comprise zirconia, titania, ZnS, ZnO, tin oxides, antimony oxides, or combinations thereof.
5. The article of any one of embodiments 2 through 4 wherein the inorganic nanoparticles are surface-modified inorganic nanoparticles.
6. The article of embodiment 5 wherein a surface-modified inorganic nanoparticle comprises a surface modifier comprising silane functionality, hydroxyurea functionality, acid functionality, or combinations thereof.
7. The article of any one of embodiments 2 through 6 wherein the inorganic nanoparticles without surface modification have an index of refraction at least 1.8
8. The article of any one of embodiments 1 through 7 wherein the polymerized acrylate matrix has an index of refraction that is within ±5% of the average of the indices of refraction of the substrate and the inorganic material of the trace.
9. The article of any one of embodiments 1 through 8 wherein the polymerized acrylate matrix is formed from one or more of (meth)acrylate monomers, (meth)acrylamide monomers, (meth)acrylate-functional oligomers, (meth)acrylamide-functional oligomers, (meth)acrylate copolymers having pendant (meth)acryloyl groups and optional hydroxyl groups, (meth)acrylate-derived oligomeric or polymeric groups on inorganic nanoparticles, (meth)acrylamide-derived oligomeric or polymeric groups on inorganic nanoparticles, or combinations thereof.
10. The article of any one of embodiments 1 through 9 wherein the polymerized acrylate matrix comprises aromatic groups.
11. The article of any one of embodiments 1 through 10 wherein the polymerized acrylate matrix comprises bromide, phosphorous, N-hydroxyurea, sulfur groups, or combinations thereof.
12. The article of any one of embodiments 1 through 11 wherein the difference between the indices of refraction of the substrate and the inorganic material of the trace is greater than 0.2.
13. The article of any one of embodiments 1 through 12 wherein the layer comprising the polymerized acrylate matrix has a thickness sufficient to completely cover the trace.
14. The article of any one of embodiments 1 through 13 wherein the inorganic electro-conductive trace comprises indium tin oxide, doped ZnO, or antimony tin oxide.
15. The article of any one of embodiments 1 through 14 wherein the substrate comprises glass, polyethylene terephthalate, cyclo-olefin copolymer, polycarbonate, polymethyl methacrylate, or a polarizer film.
16. The article of any one of embodiments 2 through 15 wherein the polymerized acrylate matrix with inorganic nanoparticles dispersed therein has an index of refraction of 1.55-1.9.
17. The article of any one of embodiments 1 through 15 wherein the polymerized acrylate matrix without inorganic nanoparticles has an index of refraction of 1.55-1.72.
18. The article of any one of embodiments 1 through 17 wherein the substrate has an index of refraction of 1.45-1.65.
19. The article of any one of embodiments 1 through 18 wherein the inorganic material of the trace has an index of refraction at least 1.65.
20. The article of any one of embodiments 1 through 19 wherein the substrate is, or is part of, a transparent display substrate selected from a lens, a touch sensor, a light emissive display, or a light reflective display.
21. A method of making an article, the method comprising:
    providing a patterned substrate comprising a substrate surface with an inorganic electro-conductive trace adjacent thereto, wherein the substrate and the inorganic material of the trace each has an index of refraction; and
    applying a polymerized acrylate matrix to at least a portion of the patterned substrate surface;
    wherein the polymerized acrylate matrix has an index of refraction that is within ±10% of the average of the indices of refraction of the substrate and the inorganic material of the trace.
22. The method of embodiment 21 wherein applying a polymerized acrylate matrix comprises applying a laminate to at least a portion of the patterned substrate surface, wherein the laminate comprises:
    a layer comprising an optically clear adhesive; and
    a layer comprising a polymerized acrylate matrix adjacent to the layer comprising an optically clear adhesive;
    wherein the laminate is positioned such that the polymerized acrylate matrix is disposed between the patterned substrate surface and the optically clear adhesive.
23. The method of embodiment 21 or 22 wherein the polymerized acrylate matrix comprises inorganic nanoparticles dispersed therein.
24. The method of embodiment 23 wherein the inorganic nanoparticles are surface-modified inorganic nanoparticles.
25. The method of any one of embodiments 21 through 24 wherein after applying the laminate, the method further comprises applying radiation to the polymerized acrylate matrix to crosslink the acrylate matrix or to increase the crosslinking of the acrylate matrix.

26. A method of coating, the method comprising:
providing a patterned substrate comprising a substrate surface with an inorganic electro-conductive trace adjacent thereto, wherein the substrate and the inorganic material of the trace each has an index of refraction;
applying a coating composition to at least a portion of the patterned substrate surface to form a coated surface, wherein the coating composition comprises a polymerizable acrylate matrix; and
polymerizing the polymerizable acrylate matrix to form a layer comprising a polymerized acrylate matrix;
wherein the polymerized acrylate matrix has an index of refraction that is within ±10% of the average of the indices of refraction of the substrate and the inorganic material of the trace.

27. The method of embodiment 26 further comprising applying an optically clear adhesive on the coated surface, wherein polymerizing the polymerizable acrylate matrix occurs before or after applying the optically clear adhesive.

28. The method of embodiment 26 or 27 wherein the coating composition further comprises inorganic nanoparticles dispersed therein.

29. The method of embodiment 28 wherein the inorganic nanoparticles are surface-modified inorganic nanoparticles.

30. The method of any one of embodiments 26 or 29 wherein the coating composition further comprises an initiator.

31. The method of embodiment 30 wherein the initiator is a free-radical initiator.

32. The method of any one of embodiments 26 through 31 wherein the coating composition further comprises a solvent.

33. A method of coating, the method comprising:
providing a patterned substrate comprising a substrate surface with an inorganic electro-conductive trace adjacent thereto;
applying a coating composition to at least a portion of the patterned substrate surface to form a coated surface, wherein the coating composition comprises:
a polymerizable acrylate matrix comprising N-hydroxyurea functional groups;
inorganic nanoparticles dispersed in the polymerizable acrylate matrix; and
an initiator; and
polymerizing the polymerizable acrylate matrix to form a layer comprising a polymerized acrylate matrix.

34. The method of embodiment 33 further comprising applying an optically clear adhesive on the coated surface, wherein polymerizing the polymerizable acrylate matrix occurs before or after applying the optically clear adhesive.

35. The method of embodiment 33 or 34 wherein the substrate and the inorganic material of the trace each has an index of refraction, and wherein the polymerized acrylate matrix has an index of refraction that is within ±10% of the average of the indices of refraction of the substrate and the inorganic material of the trace.

36. The method of any one of embodiments 33 through 35 wherein the inorganic nanoparticles are surface-modified inorganic nanoparticles.

37. The method of any one of embodiments 33 through 36 wherein the coating composition further comprises an initiator.

38. The method of embodiment 37 wherein the initiator is a free-radical initiator.

39. The method of any one of embodiments 33 through 38 wherein the coating composition further comprises a solvent.

40. The method of any one of embodiments 33 through 39 wherein the N-hydroxyurea functional groups promote adhesion of the coating to substrates selected from glass, ITO-patterned glass, unprimed PET, and cyclo-olefin copolymers.

41. The method of any one of embodiments 33 through 40 wherein the weight percentage of N-hydroxyurea functional groups is at least 0.5 wt % of the coating.

42. The method of any one of embodiments 33 through 41 wherein the N-hydroxyurea functional groups are not provided as functional groups on the inorganic nanoparticles.

43. The method of any one of embodiments 33 through 42 wherein the N-hydroxyurea functional groups are provided as functional groups in one or more monomers of the polymerizable or polymerized acrylate matrix.

44. An article comprising:
a substrate comprising a substrate surface, wherein the substrate is selected from glass, ITO-patterned glass, unprimed PET, and cyclo-olefin copolymers; and
a polymerized acrylate matrix coating disposed thereon, wherein the polymerized acrylate matrix comprises N-hydroxyurea functional groups;
wherein the N-hydroxyurea functional groups promote adhesion of the coating to the substrate.

45. The article of claim 44 wherein the weight percentage of N-hydroxyurea functional groups is at least 0.5 wt-% of the coating.

46. The article of embodiments 44 or 45 wherein the N-hydroxyurea functional groups are not provided as functional groups on the inorganic nanoparticles.

47. The article of any one of embodiments 44 through 46 wherein the N-hydroxyurea functional groups are provided as functional groups in one or more monomers of the polymerizable or polymerized acrylate matrix.

48. A laminate comprising:
a first liner;
a layer comprising a high index material adjacent the first liner;
a layer comprising a low index material adjacent the layer comprising a high index material; and
a second liner adjacent the layer comprising a low index material.

49. The laminate of embodiment 48 wherein the low index material is an optically clear adhesive, and the high index material is a polymerized acrylate matrix with optional inorganic nanoparticles dispersed therein.

50. The laminate of embodiment 48 or 49 wherein the polymerized acrylate matrix with optional inorganic nanoparticles dispersed therein is an adhesive.

51. The laminate of embodiment 50 wherein the adhesive is at least one of a pressure sensitive adhesive and a heat-activated adhesive.

52. A laminate comprising:
a first liner;
a first layer comprising a high index material adjacent the first liner;
a layer comprising a low index material adjacent the layer comprising a high index material;

a second layer comprising a high index material adjacent the layer comprising a low index material; and a second liner adjacent the second layer comprising a high index material.

53. The laminate of embodiment 52 wherein the low index material is an optically clear adhesive, and the high index material is a polymerized acrylate matrix with optional inorganic nanoparticles dispersed therein.

54. The laminate of embodiment 52 or 53 wherein the polymerized acrylate matrix with optional inorganic nanoparticles dispersed therein is an adhesive.

55. The laminate of embodiment 54 wherein the adhesive is at least one of a pressure sensitive adhesive and a heat-activated adhesive.

EXAMPLES

Objects and advantages of this disclosure are further illustrated by the following examples, but the particular materials and amounts thereof recited in these examples, as well as other conditions and details, should not be construed to unduly limit this disclosure.

Materials

| Materials | |
|---|---|
| Abbreviation or Trade Name | Description |
| $ZrO_2$-DISP1 | A 41.08% (wt) solids aqueous, zirconium oxide dispersion with an average particle size of about 8 nm, prepared by the procedures disclosed in U.S. Pat. No. 7,241,437, Example 6. |
| $ZrO_2$-DISP2 | A 47.7% (wt) solids aqueous, zirconium oxide dispersion with an average particle size of 8 nm, prepared by the procedures disclosed in U.S. Pat. No. 7,241,437, Example 6. |
| NTB-1 | A 15% (wt) aqueous titanium oxide dispersion with an average particle size of in the range of 10-20 nm and a pH of 4, available under the trade designation "NTB-1" from, Showa Denko K.K., Tokyo Japan. |
| PhTMOxS | Phenyltrimethoxysilane, available from Sigma-Aldrich, St. Louis, Missouri. |
| 3-MPTMOxS | 3-Mercaptopropyltrimethoxysilane, available under the trade designation "SIM6476.0" from Gelest Inc, Morrisville, Pennsylvania. |
| A-174 | Gamma methacryloxypropyltrimethoxy silane available under the trade designation "SILQUEST A-174 SILANE" from Crompton Corp., Lisle, Illinois. |
| A-1230 | A polyethyleneglycol-silane available under the trade designation "SILQUEST A-174 SILANE" from Crompton Corp. |
| IOA | Isooctyl acrylate, available from Arkema, Philadelphia, Pennsylvania. |
| 2-EHA | 2-Ethyl hexyl acrylate, available from Dow Chemical Company, Midland, Michigan. |
| BA | n-Butyl acrylate, available from BASF, Charlotte, North Carolina. |
| HEA | Hydroxyethyl acrylate, available from Dow Chemical Company. |
| Acm | Acrylamide, available from Sigma-Aldrich. |
| SR601 | Ethoxylated (4) bisphenol A, available under the trade designation "SR601" available from Sartomer USA, LLC, Exton, Pennsylvania. |
| EM2206 | A 40/60 (wt./wt.) mixture of bisphenol-fluorene diacrylate and o-phenyl-phenoxyethyl acrylate, available from Eternal Chemical Co. Kaosiung, Taiwan. The refractive index of liquid EMM2206 is about 1.59-1.6. |
| IEM | 2-isocyanatoethyl methacrylate, available under the trade designation "KARENZ MOI" from Showa Denko, Tokyo, Japan. |
| HDDA | 1,6 Hexandiol diacrylate, available under the trade designation "SR238" available from Sartomer USA, LLC, Exton, Pennsylvania. |
| ABP | 4-Acryloxy benzophenone, prepared according to U.S. Pat. No. 4,737,559. |
| Irg1010 | Pentaerythritol Tetrakis(3-(3,5-di-tert-butyl-4-hydroxyphenyl)propionate), available under the trade designation "IRGANOX 1010" from BASF, Tarrytown, New York. |
| Irg127 | 2-Hydroxy-1-{4-[4-(2-hydroxy-2-methyl-propionyl)-benzyl]-phenyl}-2-methyl-propan-1-one, a photoinitiator available under the trade designation "Irgacure 127" from BASF Corporation, Florham Park, New Jersey. |
| EGBTG | Ethylene glycol bisthioglycolate, available from Sigma-Aldrich. |
| HA | Hydroxylamine, available from Sigma-Aldrich. |
| MEHQ | Hydroquinone monomethyl ether, purchased from Alfa Aesar, Ward Hill, Massachusetts. |
| 2-PhThEA | 2-(Phenylthio)ethyl acrylate, available under the trade designation "BIMAX-PTEA" from Bimax Chemicals Ltd., Brodheadsville, Pennsylvania. |

Materials

| Abbreviation or Trade Name | Description |
|---|---|
| 2-BiPhOxHA | 2-biphenyl hexyl acrylate), as described in U.S. Pat. Publ. 2009/0105437, Preparative Example 2. |
| CN120 | Bisphenol-A epoxy diacrylate, available under the trade designation "CN120" from Sartomer USA, LLC. |
| HR6042 | Ethoxylated bisphenyl flurorene diacrylates blended with diluents available under the trade designation "HR6042", from Miwon Specialty Chemical Co. Ltd., Gyeonggi-do, Korea. |
| Vazo 67 | 2,2'-Azobis(2-methylbutyronitrile), available under the trade designation "VAZO 67" from E. I. du Pont de Nemours and Company, Wilmington, Delaware. |
| Vazo 52 | 2,2-Azobis(2,4-Dimethylvaleronitrile, available under the trade designation "VAZO 52" from E. I. du Pont de Nemours and Company, Wilmington, Delaware. |
| Vazo 88 | 1,1'-Azobiscyclohexanecarbonitrile), available under the trade designation "VAZO 88" from E. I. du Pont de Nemours and Company. |
| Lup101 | 2,5-Bis(tert-butylperoxy)-2,5-dimethylhexane), available under the trade designation "LUPERSOL 101" from Elf Atochem, Philadelphia, Pennsylvania. |
| TPO-L | Ethyl-2,4,6-Trimethylbenzoylphenylphosphinate, available under the trade designation "LUCIRIN TPO-L" from BASF Corporation, Florham Park, New Jersey. |
| Lup130 | 2,5-Dimethyl-2,5-di-(tert-butylperoxy)hexyne-3, available under the trade designation "LUPERSOL 130" available from Elf Atochem. |
| 8265 OCA | A 125 micron thick OCA with refractive index of about 1.49 available from 3M Company, Saint Paul, MN, USA |
| Prostab 5198 | A polymerization inhibitor available under the trade designation "PROSTAB 5198" from, BASF Corporation (previously Ciba Specialty Chemicals Corporation), Tarrytown, New York. |

Test Methods and Preparation Procedures
Patterned ITO Optical Test

ITO patterned glass substrates or ITO patterned polyester (PET) film substrates were used in the Patterned ITO Optical Test to determine the high refractive index coating layer's ability to hide the ITO pattern from visual detection. The ITO pattern was the common diamond shape and the ITO thickness was about 29 nm as measured with tapping mode atomic force microscope (AFM). The refractive index of the ITO trace measured with reflective spectral ellipsometry was 1.83 at 600 nm wavelength and the refractive index of the exposed glass substrate was 1.53 at 600 nm wavelength. A piece of transfer tape (tight liner/8265 OCA/High RI adhesive/easy release liner) was laminated to the ITO patterned glass or PET substrate, by removing the easy release liner and contacting the high refractive index adhesive layer with the ITO patterned glass substrate. The tight release liner of the transfer tape was then removed and a clear, 5 mil (127 micron) thick, piece of PET (available under the trade designation MELINEX 617 from E.I. du Pont de Nemours and Company, Wilmington, Del.) was laminated on the exposed 8265 OCA adhesive surface. The ITO patterned glass substrate was then visually observed to see if the high refractive index adhesive coating of the transfer tape was able to hide the ITO pattern.

Patterned ITO Compatibility Test

Laminate samples were prepared as described in the Patterned ITO Optical Test, except the glass substrate with ITO traces was replaced by a PET film with ITO traces made internally at 3M Company, Methuen, Mass. This is a generic test strip consisting of five parallel ITO traces terminated in carbon coated connector pads. The traces are about 15 cm long and have an average electrical resistance of 60 Ohm/square. No protective coating is applied over the ITO traces. An initial surface resistance was measured on the ITO trace using an ohm meter where electrical leads of the meter are placed across the connector pads. The resulting laminate was conditioned in an oven set at 65° C. and 90% relative humidity. The surface resistance for each trace was measured periodically over a period of 100 hours using an ohm meter. An average of the five surface resistance measurements was recorded. The % resistance change versus a control (ITO surface directly exposed to the atmosphere) is reported.

Refractive Index Measurement

The refractive indices of the optical coatings were measured at 632.8 nm using a Metricon MODEL 2010 prism coupler (Metricon Corporation Inc., Pennington, N.J.). The samples were prepared by applying the high index coating on PET film, MELINEX 617 from E. I. du Pont de Nemours and Company, Wilmington, Del., and drying in air at ambient conditions.

Optical Property Measurements

The haze (%) and transmission (%) were measured using a Haze-Gard Plus from BYK-Gardner USA, Columbia, Md. Prior to testing, transfer tapes were laminated to a glass slide with polymerized high refractive index material or, if used, the 8265 OCA adhering to the slide. If a hard coat was used, the hard coating on PET film was tested, as fabricated in the specific examples.

ITO Pattern Hiding Test

The ITO pattern hiding performance testing method was established as follows. Samples were mounted on a notebook display with white screen on illuminating from underneath. Performance of the samples was measured using a Prometric camera PM-1453F-1 (available from Radiant Imaging, Redmond, Wash.). The ITO pattern hiding performance is determined by the contrast ratio (CR) of the ITO pattern, where: $CR=(I_{peak}-I_{valley})/(I_{peak}+I_{valley})$. I represents the luminance measured in Candela/m². The smaller the CR, the better the ITO trace hiding performance of the given coating.

Cross-Hatch Adhesion Test

A standard cross-hatch adhesion test was used for evaluating the adhesion of optical coatings on various substrates, including ITO patterned glass substrate, glass, PET, MELINEX 617, cyclo-olefin copolymer film available under the trade designation "ZEONOR COP", from Zeon Chemicals L.P. Louisville, Ky. Using a razor blade, three cross-hatch patterns of squares were generated. A tape "3M SCOTCH 810" available from the 3M Company, St. Paul, Minn., was applied to the cross-hatch area. The tapes were pulled rapidly, to remove them from the substrate, and the percent adhesion was quantified by the area fraction of coating removed from the squares in the cross-hatch patterns. A sample was indicated to "pass" the adhesion test, if none of the coating was removed from the substrate.

Preparation of Polymer-Grafted $ZrO_2$ Nanoparticle High Refractive Index Adhesive I A 250 mL three-neck flask, equipped with a condenser, temperature controller, and nitrogen purge tube, was charged with 50.1 g of $ZrO_2$-DISP1. To this dispersion, 60 g of 1-methoxy-2-propanol was added under rapid stirring. The mixture was $N_2$ purged for 30 min. Next, 3.145 g of PhTMOxS and 1.33 g of 3-MPTMOxS were added. The mixture was heated to 50° C. followed by the addition of 20 g of additional 1-methoxy-2-propanol and 100 g of toluene. The mixture was stirred and heated to and maintained at 80° C., under a $N_2$ purge, for 16 hours.

The mixture was allowed to cool to room temperature, followed by the addition of 2.24 g of IOA, 10.16 g of 2-PhThEA, and 0.075 g of Vazo 67 to the mixture. After 30 minutes of mixing, the reaction was allowed to proceed at 70° C. under a $N_2$ purge for 16 hours.

The solvents were removed via rotary evaporator using a 50° C. water bath. Additional toluene was added to dissolve the recovered solid, forming a slightly translucent, polymer-grafted $ZrO_2$ dispersion at 36.4% solids (wt.), Polymer-Grafted $ZrO_2$ Nanoparticle Adhesive Coating I. The dispersion was coated on PET film, MELINEX 617, and dried in air at ambient temperature, resulting in a transparent, tacky adhesive, Polymer-Grafted $ZrO_2$ Nanoparticle High Refractive Index Adhesive I. The refractive index of Polymer-Grafted $ZrO_2$ Nanoparticle High Refractive Index Adhesive I was 1.67.

Preparation of Polymer-Grafted $ZrO_2$ Nanoparticle High Refractive Index Adhesive II A 250 mL three-neck flask equipped with a condenser, temperature controller, and nitrogen purge tube was charged with 60 g of $ZrO_2$-DISP1. To this dispersion, 60 g of 1-methoxy-2-propanol was added under rapid stirring. The mixture was $N_2$ purged for 30 min. Next, 3.78 g of PhTMOxS and 1.59 g of 3-MPTMOxS was added. The mixture was heated to 50° C. followed by the addition of 20 g of additional 1-methoxy-2-propanol and 100 g of toluene. The mixture was stirred and heated to and maintained at 80° C., under a $N_2$ purge, for 16 hours.

The temperature was lowered to 70° C., followed by the addition of 2.68 g of IOA, 6.08 g of 2-BiPhOxHA and 6.09 g of 2-PhThEA, and 0.075 g of Vazo 67. The reaction was allowed to proceed at 70° C. under a $N_2$ purge for 16 hours.

The solvents were removed via rotary evaporator using a 50° C. water bath, forming a white solid. Next, 100 g of tetrahydrofuran was added to dissolve the solid, forming a slightly translucent dispersion, followed by the addition of 80 g of toluene. The solvent was further removed using rotary evaporator to form a slightly translucent, polymer-grafted $ZrO_2$ dispersion at 36.63% solids (wt.), Polymer-Grafted $ZrO_2$ Nanoparticle Adhesive Coating II. The dispersion was coated on PET film, MELINEX 617, and dried in air at ambient temperature, resulting in a transparent, tacky adhesive, Polymer-Grafted $ZrO_2$ Nanoparticle High Refractive Index Adhesive II. The refractive index of Polymer-Grafted $ZrO_2$ Nanoparticle High Refractive Index Adhesive II was 1.662.

Preparation of Polymer-Grafted $ZrO_2$ Nanoparticle High Refractive Index Adhesive III A 250 mL three-neck flask equipped with a condenser, temperature controller, and nitrogen purge tube was charged with 59.2 g of a $ZrO_2$-DISP1. To this dispersion, 60 g of 1-methoxy-2-propanol was added under rapid stirring. The mixture was $N_2$ purged for 30 min. 3.7 g of PhTMOxS and 1.59 g of 3-MPTMOxS was weighed in a small beaker and added to the flask. The beaker was rinsed with 20 g 1-methoxy-2-propanol, which was added to the flask. The mixture was heated to 50° C. and 60 g of toluene were added. The mixture was stirred and heated to and maintained at 78° C., under a $N_2$ purge, for 16 hours.

The solution was cooled to room temperature, followed by the addition of 40 g toluene, 1.6 g of IOA, 13.37 g of 2-PhThEA, 1.39 g of a ABP/IOA 24/76 (wt./wt.) premix, 0.045 g HDDA and 0.09 g of Vazo 67. After 30 minute mixing, the stirred mixture was heated to and maintained at 70° C. for 16 hours under a $N_2$ purge.

The solvents were removed using a rotary evaporator with a 50° C. water bath, followed by the addition of 80 g of toluene. The solvent was further removed to form a slight translucent polymer-grafted $ZrO_2$ dispersion at 35% solids (wt.), Polymer-Grafted $ZrO_2$ Nanoparticle Adhesive Coating III. The dispersion was coated on PET film, MELINEX 617, and dried in the air at ambient temperature, resulting in a transparent tacky adhesive, Polymer-Grafted $ZrO_2$ Nanoparticle High Refractive Index Adhesive III. The refractive index of Polymer-Grafted $ZrO_2$ Nanoparticle High Refractive Index Adhesive III was 1.656.

Preparation of Polymer-Grafted $ZrO_2$ Nanoparticle High Refractive Index Adhesive IV In a brown 8 ounce jar, 30.48 g of 2-PhThEA, 7.24 g of IOA, 0.38 g of HEA, 0.19 g of Vazo 67, 0.64 g of 3-MPTMOxS, and 120 g of toluene were added. The mixture was $N_2$ purged for 20 min and then the jar was sealed. The jar was placed in 70° C. water-bath for 24 hours to polymerize the monomers forming a silane terminated polymer solution.

A 500 ml three-neck flask equipped with a condenser, temperature controller, and nitrogen purge tube, was charged with 129.2 g of $ZrO_2$-DISP2, 156 g of 1-methoxy-2-propanol, 9.66 g of PhTMOxS, 1.78 g of 3-MPTMOxS and the silane terminated polymer solution prepared above. The solutions were mixed together under rapid stirring. After 30 min, the mixture was heated to 78° C. for 16 hours. The entire reaction process was conducted under an $N_2$ purge.

After the reaction, the mixture was transferred to a round flask, and the solvents were removed by rotary evaporation using a water bath having a temperature of 53° C. During rotary evaporation, a white solid formed in the solution. Excess aliquots of 200 g of toluene were added to form a homogenous translucent suspension. Rotoray evaporation was continued, removing the solvents, until the water was completely removed. The solution became more transparent. Additional toluene was added, producing a transparent polymer-Grafted $ZO_2$ sol with 35% (wt.) solids. The dispersion was coated on PET film, MELINEX 617, and dried in the air at ambient temperature, resulting in a transparent tacky adhesive, Polymer-Grafted $ZrO_2$ Nanoparticle High Refractive Index Adhesive IV. The refractive index of Polymer-Grafted $ZrO_2$ Nanoparticle High Refractive Index Adhesive IV was 1.66.

Example 1

A piece of 8265 OCA, available from the 3M Company, St. Paul, Minn., was cut into a rectangular strip 12 cm×40 cm. The "easy" release liner was removed and the rectangular strip was placed on a glass slide with the exposed adhesive surface facing up. Using a #10 wire-wound rod, available from R.D. Specialties, Webster, N.Y., Polymer Grafted $ZrO_2$ Nanoparticle Adhesive Coating I was coated onto the exposed adhesive surface of 8265 OCA. The coating was allowed to dry, in air at ambient temperature for 15 minutes, forming a layer of Polymer-Grafted $ZrO_2$ Nanoparticle High Refractive Index Adhesive I. The thickness of the dried coating was about 3 microns. A easy release liner, was laminated to the exposed, dried adhesive layer forming a transfer tape, Example 1.

Following the Patterned ITO Optical Test described above, the ITO traces were examined for an ITO patterned glass/adhesive laminate prepared from Example 1 and compared to an ITO patterned glass/adhesive laminate prepared with Comparative Example 4 (8265 OCA only). The ITO pattern was much less visible for the ITO patterned substrate/adhesive laminate containing Examples 1, as compared to patterned substrate/adhesive laminate containing Comparative Example 4. When tested for ITO compatibility, following the Patterned ITO Compatibility Test, the resistance change was less than 1%.

Example 2

Example 2 was prepared identically to that of Example 1, except Polymer-Grafted $ZrO_2$ Nanoparticle Adhesive Coating II was used in place of Polymer-Grafted $ZrO_2$ Nanoparticle Adhesive Coating I, producing a transfer tape having a layer of Polymer-Grafted $ZrO_2$ Nanoparticle High Refractive Index Adhesive II, Example 2.

Following the Patterned ITO Optical Test described above, the ITO traces were examined for an ITO patterned substrate/adhesive laminate prepared from Example 2 and compared to an ITO patterned substrate/adhesive laminate prepared with Comparative Example 4 (8265 OCA). The ITO pattern was much less visible for the ITO patterned glass/adhesive laminate containing Examples 2, as compared to patterned glass/adhesive laminate containing Comparative Example 4. When tested for ITO compatibility, following the Patterned ITO Compatibility Test, the resistance change was less than 1%.

Example 3

Example 3 was prepared identically to that of Example 1, except Polymer-Grafted $ZrO_2$ Nanoparticle Adhesive Coating III was used in place of Polymer-Grafted $ZrO_2$ Nanoparticle Adhesive Coating I, producing a transfer tape having a layer of Polymer-Grafted $ZrO_2$ Nanoparticle High Refractive Index Adhesive III, Example 3. The thickness of the high refractive index adhesive was about 3 microns.

Following the Patterned ITO Optical Test described above, the ITO traces were examined for an ITO patterned PET substrate/adhesive laminate prepared from Example 1 and compared to an ITO patterned PET substrate/adhesive laminate prepared with Comparative Example 4 (8265 OCA only). The ITO pattern was much less visible for the ITO patterned PET substrate/adhesive laminate containing Examples 3, as compared to patterned substrate/adhesive laminate containing Comparative Example 4.

Comparative Example 4

A single layer of 8265 OCA was laminated on the ITO-patterned glass substrate. The refractive index of the OCA, 1.49, was a close match to the refractive index of the glass, about 1.50, used for the ITO-patterned substrate. When tested for ITO compatibility, following the Patterned ITO Compatibility Test, the resistance change was less than 1%. However, the ITO traces were very visible in the Patterned ITO Optical Test and thus this sample has no hiding power of the traces.

Comparative Example 5

Comparative Example 5 was identical to Comparative Example 4, except the ITO-patterned glass substrate was replaced with an ITO-patterned PET film substrate. Results are summarized in Table 1.

TABLE 1

| Examples | Substrates | RI | ITO Trace Hiding | Optical Properties Transmission (%) | Haze (%) | ITO compatibility (% resistance change) |
|---|---|---|---|---|---|---|
| Example 1 | ITO-Glass | 1.67 | Good | 90.7 | 1.88 | <1% |
| Example 2 | ITO-Glass | 1.662 | Good | 91.0 | 1.25 | <1% |
| Example 3 | ITO-PET | 1.656 | Good | 90.9 | 0.74 | <1% |
| Comparative Example 4 | ITO-Glass | 1.49 | Poor | | | <1% |
| Comparative Example 5 | ITO-PET | 1.49 | Poor | | | <1% |

Preparation of A-174 Surface Modified $ZrO_2$ Nanoparticle High Refractive Index Hard Coat Solution A 2000 ml 3-neck flask equipped with an addition funnel, temperature controller, paddle stirrer, oil bath and distilling head was charged with 500 g of 47.7% solids (wt.) $ZrO_2$-DISP2 dispersion. To this dispersion, a premix of 358.6 g deionized water and 0.54 g 5% (wt.) Prostab 5198 (aqueous solution) was added with stirring. Next, 758.6 g 1-methoxy-2-propanol was added to the batch, followed by the addition of 63.9 g 3 A-174 and 100 g 1-methoxy-2-propanol. The batch was heated to 80° C. and held for about 16 hours. The resulting mixture was a viscous, opaque, white liquid. The mixture was cooled to room temperature. The water was removed from the batch by alternate vacuum distillation and addition of 1.782 g 1-methoxy-2-propanol. The batch was further concentrated by vacuum distillation to result in a low viscosity, translucent dispersion with 59.1% solids (wt.), forming A-174 modified $ZrO_2$ nanoparticle dispersion.

Nanoparticles (10 g of A-174 modified $ZrO_2$ nanoparticle dispersion), 1.48 g of SR601, 0.14 g of 127 and 13 g of MEK (methyl ethyl ketone) were mixed together to form a homogeneous hard coat solution.

Example 6

The above hard coat solution was coated on ITO patterned glass substrate using #8 wire-wound rod from R.D. Specialties, Webster, N.Y. The coating were fully cured, under $N_2$, using a "LIGHT HAMMER 6" UV system available from Fusion UV Systems, Inc., Gaithersburg, Md. The lamp power was 100% and the line speed was 30 ft/min (9.1 m/min). The ITO-pattern glass substrate was that described in the "Patterned ITO Optical Test", above. The refractive index of the cured coating was 1.69.

Under Visual inspection, the ITO traces with the 1.69 refractive index coating, Example 6, were significantly less visible, as compared to the ITO traces coated with 8265 OCA, Comparative Example 4.

Preparation of Hydroxyurea-Ligand1A Modified $ZrO_2$ Nanoparticle Resin Solution1

Ligand1A was prepared as follows. In a 1 L flask equipped with a magnetic stir bar, 250 mL of tetrahydrofuran and 16.2 g of a 50% aqueous solution of hydroxylamine were added. The solution was cooled to 2° C., in an ice bath. With stirring, 39.5 g of IEM was added slowly, maintaining the solution temperature below 8° C. After 2 hours, the ice bath was removed. The solution was further stirred at room temperature for an additional hour. The chemical structure of Ligand1A is shown below

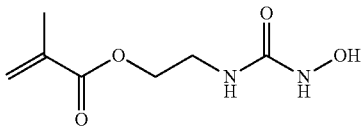

Ligand1A modified $ZrO_2$ nanoparticle solution was prepared according to Example 1 of U.S. Patent Application Publication No. 2011/0126734. The low viscous, translucent surface treated $ZrO_2$ solution was 53.2% (wt) zirconia dispersed in 1-methoxy-2-propanol.

In a 4 ounce jar, 30 g of Ligand1A modified ZrO2 nanoparticle solution, 3.99 g of (2-PhThEA), 16 g of MEK, 0.14 g of Irgacure 127 were mixed together to form a homogenous coating solution, Hydroxyurea-Ligand1A Modified $ZrO_2$ Nanoparticle Resin Solution.

For optical measurement, the Hydroxyurea-Ligand1A Modified $ZrO_2$ Nanoparticle Resin Solution1 was coated on a 2 mil PET film, MELINEX 617, using a #12 wire-wound rod, available from R.D. Specialties, Webster, N.Y. The resulting coating was dried in air for 15 minutes and then cured using a "LIGHT HAMMER 6" UV system available from Fusion UV Systems, Inc., Gaithersburg, Md. The lamp power was 100% and the line speed was 30 ft/min (9.1 m/min). The refractive index of this cured coating was 1.702.

Example 7

The Hydroxyurea-Ligand1A Modified $ZrO_2$ Nanoparticle Resin Solution1 was coated on ITO patterned glass surface using #12 wire-wound rod from R.D. Specialties. The coating were fully cured, under $N_2$, using a "LIGHT HAMMER 6" UV system available from Fusion UV Systems, Inc., Gaithersburg, Md. The lamp power was 100% and the line speed was 30 ft/min (9.1 m/min). The ITO-pattern glass substrate was that described in the "Patterned ITO Optical Test. The "easy" release liner of a piece of 8265 OCA was removed and the corresponding adhesive was laminated to the exposed surface of the cured Ligand1A Modified $ZrO_2$ Nanoparticle Resin coating. The "tight" release liner was removed from the OCA, and a clear, TAC film, available from FUJIFILM Corporation, Tokyo, Japan, was applied on exposed OCA surface.

Comparative Example 8

On another area of the ITO patterned glass substrate, only 8265 OCA with the tight release liner replaced with TAC film was applied, Comparative Example 8. The refractive index of Comparative Example 8 (8265 OCA) was 1.49.

Visual observation of Example 7 and Comparative Example 8 revealed that Example 7, having the high index coating, was significantly better at hiding the ITO patterned traces, compared to Comparative Example 8. The contrast ratio, as determined from the ITO Pattern Hiding Test, clearly showed the improved ITO trace hiding capabilities of Example 7 compared to Comparative Example 8 and an ITO control sample. For Comparative Example 9, the ITO trace is not visible, but the coating appearance includes strong interference fringing that is not acceptable. The testing results are summarized in FIG. 5 and Table 2.

Figure 5:
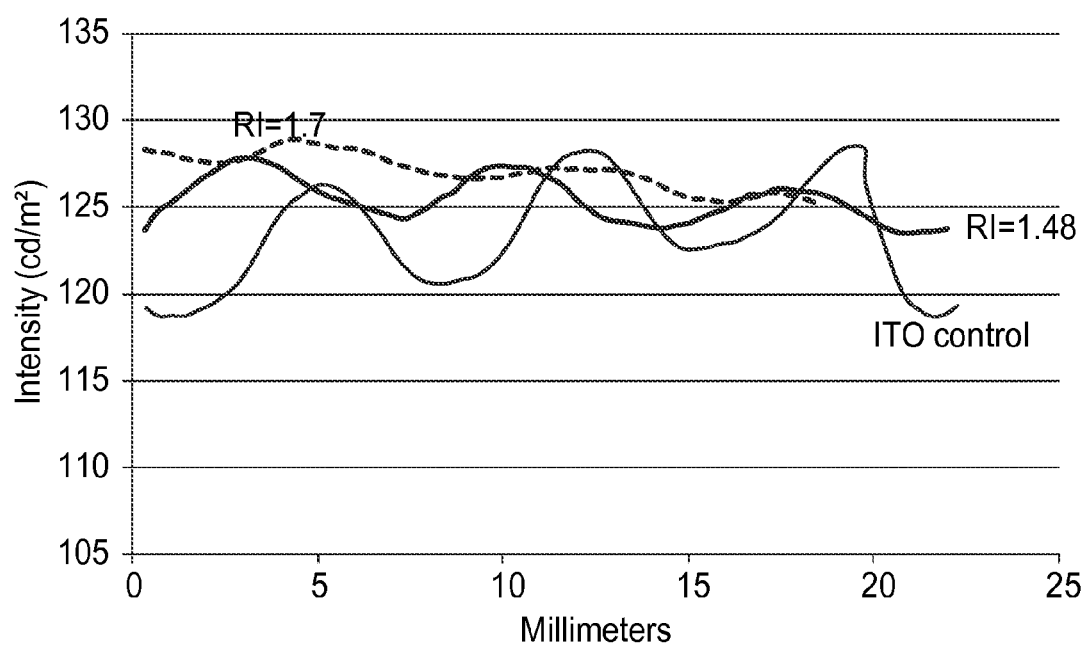
FIG. 5 is a graph showing the luminance measurement for a diamond shape ITO pattern on glass as described in the ITO Pattern Hiding Test. The x-axis is the distance scanned across the panel, the y-axis is the luminance.

FIG. 5 shows the luminance measurement for a diamond shape ITO pattern on glass as described in the ITO pattern hiding test. The three traces correspond to the respective luminance measurement of the control (uncoated ITO pattern), a regular OCA with RI 1.48 applied on top of the ITO trace (as described in Comparative 8 with RI of 1.48), or after application of a coating with RI 1.7 of this invention (Example 7). The x-axis represents the distance of the inspection scan. As the inspection beam hits the ITO trace the luminance drops vs. the non-ITO area. Thus a less wavy line indicates lower contrast ratio, resulting in better hiding of the ITO trace.

Table 2 shows the same as above with a calculation of the contrast ratio (CR) following the equation:

$$CR=(I_{peak}-I_{valley})/(I_{peak}+I_{valley}),$$

where I represents the luminance measured in Candela/m². The smaller the CR, the better the ITO trace hiding performance of the given coating.

Preparation of A-174/A-1230 Surface Modified $TiO_2$ Nanoparticle High Refractive Index Hard Coat Solution Surface treated $TiO_2$ nanoparticles were prepared as follows; 42.8 g of NTB-1, was added to a 250 ml three-necked flask. 15 g of additional water and 45 g of 1-methoxy-2-propanol were added under rapid stirring. A mixture of 1.432 g of A-174 and 0.318 g of A-1230 in 5 g of 1-methoxy-2-propanol was slowly added. The solution was heated to 80° C. and held for 16 hours under rapid stirring. Most of the solvent was then removed using rotary-evaporator. The resulting white/pale like materials was diluted in 1:1 mixture of 1-methoxy-2-propanol/MEK. The solution became more translucent/clear, and then the solvents were further removed, using rotary-evaporator, to yield a translucent, stable nanoparticle dispersion having 47% (wt) solids.

Nanoparticles (10 g of A-174/A-1230 modified $TiO_2$ particle dispersion), 1.17 g of EM2206, 0.1 g of Irg127 and 8.4 g of MEK were mixed together forming A-174/A-1230 Surface Modified $TiO_2$ Nanoparticle High Refractive Index Hard Coat Solution.

Comparative Example 9

The A-174/A-1230 Surface Modified $TiO_2$ Nanoparticle High Refractive Index Hard Coat Solution was coated and cured on an ITO patterned glass substrate, as described in Example 6, forming Comparative Example 9. The refractive index of the cured coating was 1.92.

TABLE 2

| Example | Construction | Refractive Index | Average Contrast Ratio (CR) | Visual Observation |
|---|---|---|---|---|
| ITO Control | ITO-Glass | | 0.0307 | Visible ITO Traces |
| Comparative Example 8 | ITO-Glass/ OCA/TAC | 1.48 | 0.013 | Poor Hiding of ITO Traces |
| Example 7 | ITO-Glass/ ZrO2-Resin/TAC | 1.702 | 0.0035 | Good Hiding of ITO Traces |
| Comparative Example 9 | ITO-Glass/ TiO2-Resin/TAC | 1.92 | Not Tested | ITO Traces are not visible, but there is strong interference fringing. |

Example 10

Preparation of Hydroxyurea-Ligand1A Modified $ZrO_2$ Nanoparticle Resin Solution2

In a 4 ounce jar, 30 g of N-hydroxyurea Ligand1A modified ZrO2 nanoparticles (53.2% wt dispersed in 1-methoxy-2-propanol), 3.99 g of CN120, 16 g of MEK, 0.14 g of Irg127 were mixed together to form a homogenous coating solution.

For optical measurement, refractive index and haze, Hydroxyurea-Ligand1A Modified $ZrO_2$ Nanoparticle Resin Solution1 (solution from Example 7) and Solution 2 (solution from Example 10) were coated on a PET film, MELINEX 617, using a #12 wire-wound rod (available from R.D. Specialties, Webster N.Y.). The resulting films were then dried in air for 15 minutes and then cured using the Light Hammer 6 UV system described above at 100% lamp power and a line speed of 30 feet per minute, producing Example 10. For the Cross-Hatch Adhesion Test, coating solutions were applied to ITO patterned glass and plain glass substrates, and then dried and cured in the same way as PET films. The optical measurements and adhesion results are shown in Table 3.

TABLE 3

| Example | Adhesion to Glass | Adhesion to ITO Patterned Glass | Refractive Index | Haze (%) |
|---|---|---|---|---|
| Example 7 | Pass | Pass | 1.702 | 0.98 |
| Example 10 | Pass | Pass | 1.686 | 0.84 |

Preparation of Hydroxyurea-Ligand1B

Ligand1B was prepared as follows. In a 1 L flask equipped with a magnetic stir bar, 250 mL of tetrahydrofuran and 16.2 g of a 50% aqueous solution of hydroxylamine were added. The solution was cooled to 2° C., in an ice bath. With stirring, 39.5 g of IEM was added slowly, maintaining the solution temperature below 8° C. After 2 hours, the ice bath was removed. The solution was further stirred at room temperature for an additional hour. Then, 60 g of 1-methoxy-2-propanol was added. After mixing, the solvents; including THF (tetrahydrofuran), water, and part of 1-methoxypropanol, were removed using rotary evaporate. 20 g of additional THF was added, yielding a clear solution of Ligand1B in THF/1-methoxy-2-propanol, with 55.5% solids (wt) of Ligand1B.

Example 11

Preparation of Hydroxyurea-Ligand1B Resin Solution

In a 4 ounce jar, 4.04 g of HR6042, 1.64 g of N-hydroxyurea functionalized Ligand1B prepared above, 3 g of 1-methoxy-2-propanol, 4 g of MEK, and 0.09 g of Irg127 were mixed together to form a homogenous coating solution.

Comparative Example 12

In a 4 ounce jar, 6.45 g of HR6042, 5 g of 1-methoxy-2-propanol, 5 g of MEK, and 0.13 g of Irg 127 were mixed together to form a homogenous coating solution.

For optical measurement, refractive index and haze, the solution from Example 11 and Comparative Example 12 were coated on a PET film, MELINEX 617, using a #12 wire-wound rod (available from R.D. Specialties, Webster N.Y.). The resulting films were then dried in air for 15 minutes and then cured using the Light Hammer 6 UV system described above at 100% lamp power and a line speed of 30 feet per minute, producing Example 10. For the Cross-Hatch Adhesion Test, coating solutions were applied to ITO patterned glass, PET film, MELINEX 617, and COP film substrates, and then dried and cured as described in Example 10. The optical measurements and adhesion results are shown in Table 4.

TABLE 4

| Examples | Adhesion to COP film | Adhesion to ITO Patterned Glass | Adhesion to PET | Refractive index | Haze (%) |
|---|---|---|---|---|---|
| Example 11 | Pass | Pass | Pass | 1.6003 | 1.27 |
| Comparative Example 12 | Fail | Fail | Fail | 1.6161 | 1.16 |

Preparation of A-174 Modified $ZrO_2$ Nanoparticle High Refractive Index Hot Melt OCA Solution A 2000 ml 3-neck flask equipped with an addition funnel, temperature controller, paddle stirrer, oil bath and distilling head was charged with 500 g of 47.7% solids (wt.) $ZrO_2$-DISP2 dispersion. To this dispersion, a premix of 358.6 g deionized water and 0.54 g 5% (wt.) Prostab 5198 (aqueous solution) was added with stirring. Next, 758.6 g 1-methoxy-2-propanol was added to the batch, followed by the addition of 63.9 g 3 A-174 and 100 g 1-methoxy-2-propanol. The batch was heated to 80° C. and held for about 16 hours. The resulting mixture was a viscous, opaque, white liquid. The mixture was cooled to room temperature. The water was removed from the batch by alternate vacuum distillation and addition of 1,782 g 1-methoxy-2-propanol. The batch was further concentrated by vacuum distillation to result in a low viscosity, translucent dispersion with 59.1% solids (wt.), forming A-174 modified $ZrO_2$ nanoparticle dispersion.

To a 5 liter stainless steel reactor was added: 843.0 g 2-EHA, 1125.0 g BA, 375.0 g HEA, 125.0 g Acm, 2.50 g Irg1010 anti-oxidant, 7.25 g EGBTG, and 20.5 g of 4.76 wt % MEHQ in 2-EHA. The mixture was heated, while stirring, to 60° C., and then 12.0 g of 0.25 wt % solids Vazo 52 in 2-EHA was added to the reactor and stirred. The reactor was purged of oxygen while heating then pressurized with 6 psi of nitrogen gas before reaching the induction temperature of 63° C., and the reaction proceeded adiabatically to a peak reaction temperature of 130° C.

A solution was prepared by mixing 1.0 g Vazo 52, 0.10 g Vazo 88, 0.05 g Lup101, 0.15 g Lup130 and 48.70 g ethyl acetate to a 4 oz glass jar and shaking in a reciprocating mixer to dissolve the solids. Then 17.5 g of the ethyl acetate solution and 2.42 g EGBTG were stirred into the reactor. The reactor was purged of oxygen while heating; then pressurized with 6 psi of nitrogen gas before reaching the induction temperature of 59° C. and the reaction proceeded adiabatically to a peak reaction temperature of 181° C. The reactor was cooled to 135° C. while it was partially vacuum stripped of residual monomers, and then purged with 90/10 nitrogen/oxygen control gas for 30 minutes. Then 2.84 g of IEM were added to the reactor and held at 135° C. isothermally for 2 hours. Finally 2.84 g TPO-L photoinitiator was added into the reactor and stirred for 30 minutes and the mixture was drained into 1 lb silicone lined boxes. A sample was taken of the reaction mixture from this step and the unreacted monomer was 6.81% based on the total weight of the mixture.

In 50 mL jar, 2 g of hot melt OCA was dissolved in MEK forming a 30% (wt.) solids solution. 13.6 g of A-174 modified $ZrO_2$ nanoparticle dispersion was added to the hot melt OCA solution and thoroughly mixed, forming an A-174 modified $ZrO_2$ nanoparticle high refractive index hot melt OCA solution. After oven drying and removal of the solvent, a hot melt processable OCA was obtained.

The refractive index of the hot melt OCA was measured after UV curing of the hot melt OCA coating on the CLEARSIL T10 release liner, using a "LIGHT HAMMER 6" UV system available from Fusion UV Systems, Inc., Gaithersburg, Md. The lamp power was 100% and the line speed was 30 ft/min (9.1 m/min). An additional sample of the hot melt OCA was prepared (without the 8265 OCA layer), in order to make this measurement. The refractive index was measured to be 1.64.

Example 13

The A-174 modified $ZrO_2$ nanoparticle high refractive index hot melt OCA solution was coated on a silicone release liner, available under the trade designation "CLEARSIL T10" from CPFilms, Inc., Fieldale, Va., using a #33 wire-wound rod from R.D. Specialties, Webster, N.Y. The coating was allowed to dry, in air at ambient temperature for 15 minutes, forming a modified $ZrO_2$ nanoparticle high refractive index hot melt OCA. The "easy" release liner of a piece of 8265 OCA, available from the 3M Company, St. Paul, Minn., was removed from 8265 OCA and it was laminated to the exposed surface of the hot melt OCA, forming a transfer adhesive, Example 13.

Following the Patterned ITO Optical Test described above, the ITO traces were examined for an ITO patterned glass substrate/adhesive laminate prepared from Example 1 and compared to an ITO patterned PET substrate/adhesive laminate prepared with Comparative Example 4 (8265 OCA only). The ITO pattern was much less visible for the ITO patterned glass substrate/adhesive laminate containing Example 13, as compared to patterned substrate/adhesive laminate containing Comparative Example 4.

The complete disclosures of the patents, patent documents, and publications cited herein are incorporated by reference in their entirety as if each were individually incorporated. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. An article comprising:
   a patterned substrate comprising a substrate surface with an inorganic electro-conductive trace adjacent thereto, wherein the substrate and the inorganic material of the trace each has an index of refraction; and
   a layer comprising a polymerized acrylate matrix adjacent to at least a portion of the surface of the substrate and the inorganic electro-conductive trace, wherein the polymerized acrylate matrix has an index of refraction that is within ±10% of the average of the indices of refraction of the substrate and the inorganic material of the trace;
   wherein the polymerized acrylate matrix comprises inorganic nanoparticles having an index of refraction of 1.6 or higher dispersed therein; and
   wherein the polymerized acrylate matrix comprises aromatic groups derived from acrylate monomers having an index of refraction of 1.55 or higher.

2. The article of claim 1 wherein the inorganic nanoparticles are present in the polymerized acrylate matrix in an amount of no greater than 60 volume percent.

3. The article of claim 1 wherein the inorganic nanoparticles comprise zirconia, titania, ZnS, ZnO, tin oxides, antimony oxides, or combinations thereof.

4. The article of claim 1 wherein the inorganic nanoparticles are surface-modified inorganic nanoparticles.

5. The article of claim 4 wherein a surface-modified inorganic nanoparticle comprises a surface modifier comprising silane functionality, hydroxyurea functionality, acid functionality, or combinations thereof.

6. The article of claim 1 wherein the polymerized acrylate matrix has an index of refraction that is ±5% of the average of the indices of refraction of the substrate and the inorganic material of the trace.

7. The article of claim 1 wherein the polymerized acrylate matrix is formed from one or more of (meth)acrylate monomers, (meth)acrylamide monomers, (meth)acrylate-functional oligomers, (meth)acrylamide-functional oligomers, (meth)acrylate copolymers having pendant (meth)acryloyl groups and optional hydroxyl groups, (meth)acrylate-derived oligomeric or polymeric groups on inorganic nanoparticles, (meth)acrylamide-derived oligomeric or polymeric groups on inorganic nanoparticles, or combinations thereof.

8. The article of claim 1 wherein the inorganic electro-conductive trace comprises indium tin oxide, doped ZnO, or antimony tin oxide.

9. The article of claim 1 wherein the substrate comprises glass, polyethylene terephthalate, cyclo-olefin copolymer, polycarbonate, polymethyl methacrylate, or a polarizer film.

10. The article of claim 1 wherein the substrate is, or is part of, a transparent display substrate selected from a lens, a touch sensor, a light emissive display, or a light reflective display.

11. The article of claim 1 wherein the polymerized acrylate matrix has an index of refraction of greater than 1.55.

12. The article of claim 1 wherein the aromatic groups are derived from monomers selected from the group of 2-phenoxyethyl acrylate, 2-(phenylthio)ethyl acrylate, 2-phenylphenoxyethyl acrylate, 2-propenoic acid (3-phenoxyphenyl) methyl ester, ethoxylated bisphenol A diacrylates, ethoxylated bisphenyl fluorene diacrylates, 2-biphenyl acrylate, 2-biphenyl ethyl acrylate, 2-biphenyl hexyl acrylate, 2-benzyl acrylate, and combinations thereof.

13. A method of making an article, the method comprising:
providing a patterned substrate comprising a substrate surface with an inorganic electro-conductive trace adjacent thereto, wherein the substrate and the inorganic material of the trace each has an index of refraction; and
applying a polymerized acrylate matrix to at least a portion of the patterned substrate surface;
wherein the polymerized acrylate matrix has an index of refraction that is within ±10% of the average of the indices of refraction of the substrate and the inorganic material of the trace;
wherein the polymerized acrylate matrix comprises inorganic nanoparticles having an index of refraction of 1.6 or higher dispersed therein; and
wherein the polymerized acrylate matrix comprises aromatic groups derived from acrylate monomers having an index of refraction of 1.55 or higher.

14. The method of claim 13 wherein applying a polymerized acrylate matrix comprises applying a laminate to at least a portion of the patterned substrate surface, wherein the laminate comprises:
a layer comprising an optically clear adhesive; and
a layer comprising a polymerized acrylate matrix adjacent to the layer comprising an optically clear adhesive;
wherein the laminate is positioned such that the polymerized acrylate matrix is disposed between the patterned substrate surface and the optically clear adhesive.

15. A method of coating, the method comprising:
providing a patterned substrate comprising a substrate surface with an inorganic electro-conductive trace adjacent thereto, wherein the substrate and the inorganic material of the trace each has an index of refraction;
applying a coating composition to at least a portion of the patterned substrate surface to form a coated surface, wherein the coating composition comprises a polymerizable acrylate matrix; and
polymerizing the polymerizable acrylate matrix to form a layer comprising a polymerized acrylate matrix;
wherein the polymerized acrylate matrix has an index of refraction that is within ±10% of the average of the indices of refraction of the substrate and the inorganic material of the trace;
wherein the polymerized acrylate matrix comprises inorganic nanoparticles having an index of refraction of 1.6 or higher dispersed therein; and
wherein the polymerized acrylate matrix comprises aromatic groups derived from acrylate monomers having an index of refraction of 1.55 or higher.

16. The method of claim 15 further comprising applying an optically clear adhesive on the coated surface, wherein polymerizing the polymerizable acrylate matrix occurs before or after applying the optically clear adhesive.

17. A method of coating, the method comprising:
providing a patterned substrate comprising a substrate surface with an inorganic electro-conductive trace adjacent thereto;
applying a coating composition to at least a portion of the patterned substrate surface to form a coated surface, wherein the coating composition comprises:
a polymerizable acrylate matrix comprising N-hydroxyurea functional groups and acrylate monomers having an index of refraction of 1.55 or higher;
inorganic nanoparticles having an index of refraction of 1.6 or higher dispersed in the polymerizable acrylate matrix; and
an initiator; and
polymerizing the polymerizable acrylate matrix to form a layer comprising a polymerized acrylate matrix.

18. The method of claim 17 further comprising applying an optically clear adhesive on the coated surface, wherein polymerizing the polymerizable acrylate matrix occurs before or after applying the optically clear adhesive.

19. An article comprising:
a substrate comprising a substrate surface, wherein the substrate is selected from glass, ITO-patterned glass, unprimed PET, and cyclo-olefin copolymers; and
a polymerized acrylate matrix coating disposed thereon, wherein the polymerized acrylate matrix comprises N-hydroxyurea functional groups;
wherein the N-hydroxyurea functional groups are part of one or more monomers used in making the acrylate matrix;
wherein the N-hydroxyurea functional groups promote adhesion of the coating to the substrate;
wherein the polymerized acrylate matrix comprises inorganic nanoparticles having an index of refraction of 1.6 or higher dispersed therein; and
wherein the polymerized acrylate matrix comprises aromatic groups derived from acrylate monomers having an index of refraction of 1.55 or higher.

20. The article of claim 19 wherein the N-hydroxyurea functional groups are provided as functional groups in one or more monomers of the polymerizable or polymerized acrylate matrix.

21. A transfer tape comprising:
a first release liner;
a layer comprising a high index adhesive material adjacent the first liner;
a layer comprising a low index adhesive material adjacent the layer comprising a high index material; and
a second release liner adjacent the layer comprising a low index material;
wherein the high index adhesive material comprises a polymerized acrylate matrix;

wherein the polymerized acrylate matrix comprises inorganic nanoparticles having an index of refraction of 1.6 or higher dispersed therein; and wherein the polymerized acrylate matrix comprises aromatic groups derived from acrylate monomers having an index of refraction of 1.55 or higher.

22. The transfer tape of claim 21 wherein the low index material is an optically clear adhesive.

23. The transfer tape of claim 21 wherein the adhesive material is at least one of a pressure sensitive adhesive and a heat-activated adhesive.

24. A transfer tape comprising:
a first release liner;
a first layer comprising a high index material adjacent the first liner;
a layer comprising a low index material adjacent the layer comprising a high index material;
a second layer comprising a high index material adjacent the layer comprising a low index material; and
a second release liner adjacent the second layer comprising a high index material;
wherein at least one of the layers comprising a high index material comprises a high index adhesive material;
wherein at least one of the layers comprising a high index material comprises a polymerized acrylate matrix;
wherein the polymerized acrylate matrix comprises inorganic nanoparticles having an index of refraction of 1.6 or higher dispersed therein; and
wherein the polymerized acrylate matrix comprises aromatic groups derived from acrylate monomers having an index of refraction of 1.55 or higher.

25. The transfer tape of claim 24 wherein the low index material is an optically clear adhesive.

26. The transfer tape of claim 24 wherein the adhesive material is at least one of a pressure sensitive adhesive and a heat-activated adhesive.

* * * * *

UNITED STATES PATENT AND TRADEMARK OFFICE
CERTIFICATE OF CORRECTION

PATENT NO.        : 9,477,354 B2
APPLICATION NO.   : 13/832457
DATED             : October 25, 2016
INVENTOR(S)       : Encai Hao It is certified that error appears in the above-identified patent and that said Letters Patent is hereby corrected as shown below:

In the Specification

Column 6
Line 59, delete "schema" and insert -- schematic --, therefor.

Column 9
Line 22, delete "2009//0087629," and insert -- 2009/0087629, --, therefor.

Column 11
Line 14, delete "Kaosiung," and insert -- Kaohsiung, --, therefor.

Column 11
Line 18, delete "Kaosiung," and insert -- Kaohsiung, --, therefor.

Column 13
Line 56, after "METHOD"," insert -- (Attorney Docket No. 71129US002), --.

Column 14
Line 66, after "Germany" insert -- . --.

Column 16
Line 8, delete "-hydroxethyl" and insert -- -hydroxyethyl --, therefor.

Column 17
Line 16, delete "isooctylthioglycoate," and insert -- isooctylthioglycolate, --, therefor.

Column 20
Line 54, delete "polymethymethacrylate," and insert -- polymethylmethacrylate, --, therefor.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,477,354 B2

Column 21
Lines 65-66, delete "thy-laminating" and insert -- dry-laminating --, therefor.

Column 23
Line 40, after "1.8" insert -- . --.

Columns 27-28
Line 50, approx., delete "Kaosiung," and insert -- Kaohsiung, --, therefor.

Columns 27-28
Lines 65, approx., delete "photinitiator" and insert -- photoinitiator --, therefor.

Columns 29-30
Line 8, approx., delete "flurorene" and insert -- fluorene --, therefor.

Columns 29-30
Line 31, approx., after "USA" insert -- . --.

Column 29
Line 47, approx., delete "R1" and insert -- RI --, therefor.

Column 33
Line 6, approx., delete "Rotoray" and insert -- Rotary --, therefor.

Column 33
Line 9, approx., delete "ZO$_2$" and insert -- ZrO$_2$ --, therefor.

Column 39
Line 50, delete "CLEARSIL" and insert -- CLEARASIL --, therefor.

Column 39
Lines 62-63, delete "CLEARSIL" and insert -- CLEARASIL --, therefor.